(12) United States Patent
Grover et al.

(10) Patent No.: US 8,354,853 B2
(45) Date of Patent: Jan. 15, 2013

(54) TEST ELECTRONICS TO DEVICE UNDER TEST INTERFACES, AND METHODS AND APPARATUS USING SAME

(75) Inventors: Sanjeev Grover, San Jose, CA (US); Donald W. Chiu, Santa Clara, CA (US); John W. Andberg, Santa Cruz, CA (US)

(73) Assignee: Advantest (Singapore) Pte Ltd, Singapore (SG)

( * ) Notice: Subject to any disclaimer, the term of this patent is extended or adjusted under 35 U.S.C. 154(b) by 413 days.

(21) Appl. No.: 12/626,506

(22) Filed: Nov. 25, 2009

(65) Prior Publication Data

US 2010/0134134 A1    Jun. 3, 2010

Related U.S. Application Data

(60) Provisional application No. 61/200,418, filed on Nov. 25, 2008.

(51) Int. Cl.
*G01R 31/00* (2006.01)
(52) U.S. Cl. .................................. 324/754.18
(58) Field of Classification Search .................. None
See application file for complete search history.

(56) References Cited

U.S. PATENT DOCUMENTS

| | | | |
|---|---|---|---|
| 5,092,781 A * | 3/1992 | Casciotti et al. | 439/62 |
| 5,923,180 A * | 7/1999 | Botka et al. | 324/756.01 |
| 6,036,519 A * | 3/2000 | Lopata et al. | 439/260 |
| 6,040,691 A * | 3/2000 | Hanners et al. | 324/756.07 |
| 6,348,789 B1 | 2/2002 | Terao | |
| 6,963,211 B2 * | 11/2005 | Sinsheimer et al. | 324/750.25 |
| 7,057,410 B1 | 6/2006 | Wohlfarth et al. | |
| 2006/0214679 A1 * | 9/2006 | Henson et al. | 324/765 |
| 2007/0126439 A1 | 6/2007 | Sinsheimer et al. | |

OTHER PUBLICATIONS

International Search Report and Written Opinion mailed Jul. 5, 2010 for application No. PCT/US2009/065947, 12 pages.

* cited by examiner

*Primary Examiner* — Paresh Patel
(74) *Attorney, Agent, or Firm* — Holland & Hart LLP

(57) ABSTRACT

In one embodiment, a test system has a set of test electronics for testing a device under test (DUT). The test system also has at least one test electronics to DUT interface having a zero insertion force (ZIF) connector. Each ZIF connector has a ZIF connector to DUT clamping mechanism configured to i) apply a first orthogonal force to a probe card that interfaces with a DUT, by pressing the ZIF connector against the probe card, and simultaneously ii) exert at least one second orthogonal force on the probe card, the at least one second orthogonal force being opposite in direction to the first orthogonal force.

9 Claims, 30 Drawing Sheets

US 8,354,853 B2

TEST ELECTRONICS TO DEVICE UNDER TEST INTERFACES, AND METHODS AND APPARATUS USING SAME

CROSS-REFERENCE TO RELATED APPLICATION

This application claims the benefit of U.S. Provisional Application No. 61/200,418, filed Nov. 25, 2008, which is hereby incorporated by reference for all that it discloses.

BACKGROUND

When testing electronic devices, it is often desirable to route a large number of high quality signals between the electronics of a test system and a device under test (DUT). One application where this need may be experienced most is in the test of semiconductor devices, and even more particularly, in the test of plural semiconductor devices on a semiconductor wafer (e.g., during "wafer sort").

BRIEF DESCRIPTION OF THE DRAWINGS

Illustrative embodiments of the invention are illustrated in the drawings, in which.

DETAILED DESCRIPTION

To increase the density of test electronics available at a particular "test site", and to ensure that different sets of test electronics can be placed close to their respective test sites, the test electronics may be placed on boards (e.g., printed circuit board (PCBs)) that are oriented at right angles to a plane of a device or devices under test (a DUT or DUTs). In this regard, an exemplary orientation between different sets of test electronics 102, 104, 106, 108, 110, 112, 114, 116 and a plurality of DUTs on a wafer 118 is shown, generally, in FIGS. 1 & 2.

Figure 1:
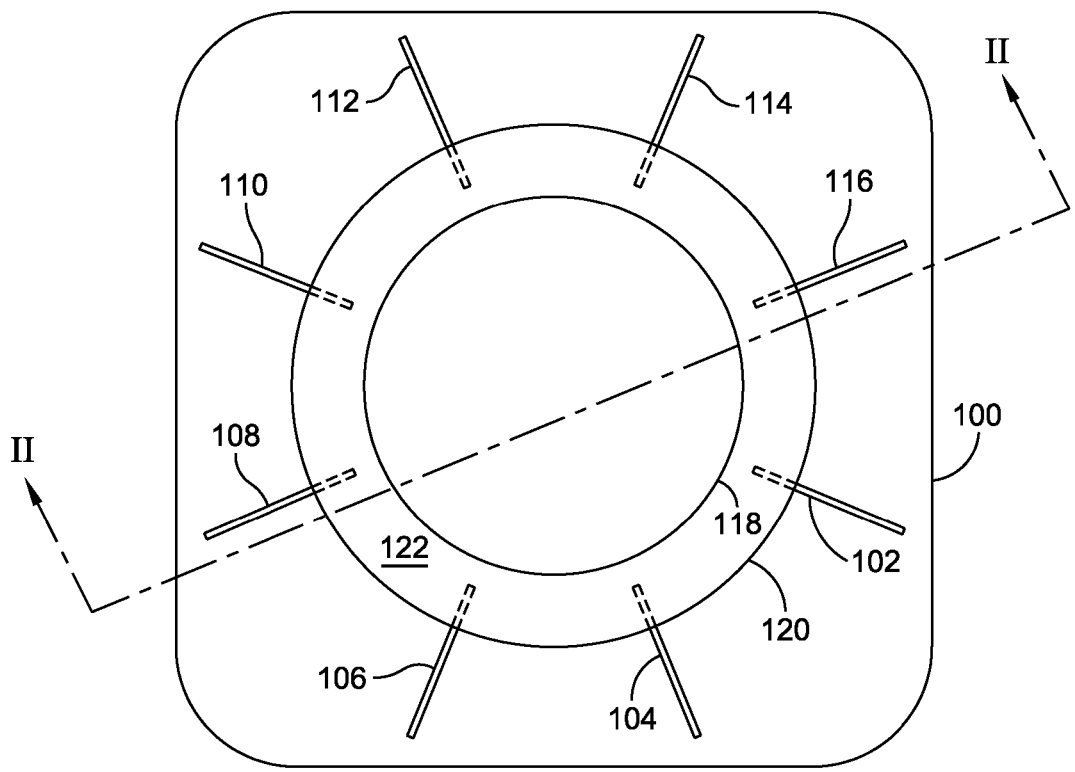
FIG. 1 illustrates a plan view of a probe card, a semiconductor wafer, and a plurality of sets of test electronics.
Figure 2:
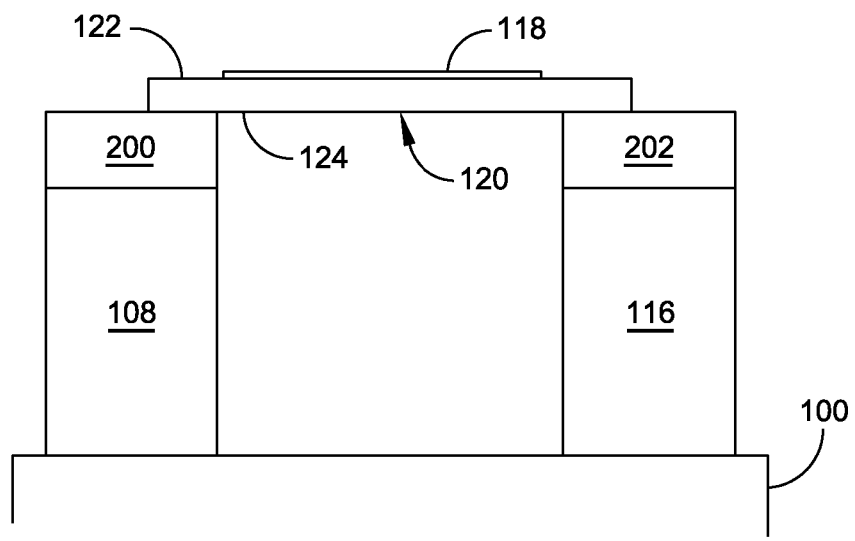
FIG. 2 illustrates a cross-sectional elevation of the probe card, wafer and test electronics shown in FIG. 1.

By way of example, FIG. 1 illustrates a plan view of a probe card 120, a semiconductor wafer 118 (i.e., a "wafer"), and a plurality of sets of test electronics 102, 104, 106, 108, 110, 112, 114, 116. The wafer 118 is positioned on, and is electrically coupled to, a first surface 122 of the probe card 120. The sets of test electronics 102, 104, 106, 108, 110, 112, 114, 116 are positioned at right angles to a second surface 124 of the probe card 120, opposite the first surface 122, and are electrically coupled to DUTs on the wafer 118 via the probe card 120. FIG. 2 illustrates a cross-sectional elevation of the probe card 120, wafer 118 and test electronics 102 shown in FIG. 1.

Because a wafer sort test system 100 is typically used to test wafers carrying many types of DUTs, and because probe cards can degrade or fail, a probe card 120 is usually coupled to the sets of test electronics 102, 104, 106, 108, 110, 112, 114, 116 via a plurality of "test electronics to DUT interfaces" 200, 202, as will be described herein. However, before describing various exemplary embodiments of such test electronics to DUT interfaces 200, 202, more details of an exemplary wafer sort test system 100 in which the test electronics to DUT interfaces 200, 202 may be used are provided.

Figure 3:
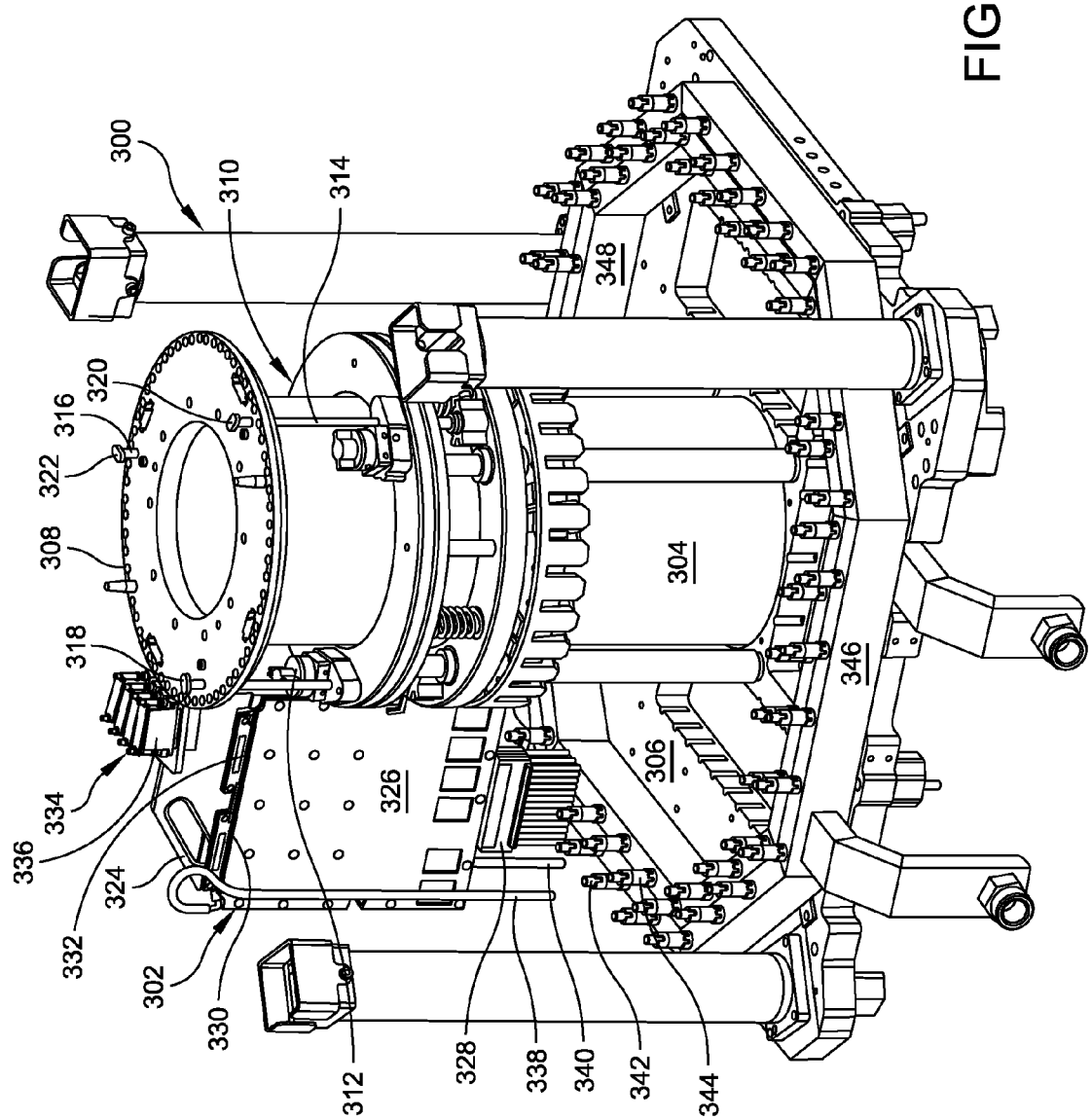
FIG. 3 illustrates an exemplary chassis for holding at least some of the test electronics of a test system.

FIG. 3 illustrates an exemplary chassis 300 for holding at least some of the test electronics assemblies 302 of a test system. By way of example, the chassis 300 is configured for a wafer sort application. The chassis 300 comprises a cylindrical hub 304 that is coupled between a chassis base 306 and a probe card receiving platform 308. A clamping system 310 surrounds the cylindrical hub 304 and provides a means to clamp probe cards to (or release them from) the probe card receiving platform 308. The clamping system 310 includes a plurality of clamping rods 312, 314, 316 that extend parallel to the cylindrical hub 304 and through the probe card receiving platform 308. Each of the clamping rods 312, 314, 316 is movable in an axial direction, and is capable of 1) moving toward the chassis base 306 to clamp a probe card to the probe card receiving platform 308, and 2) moving away from the chassis base 306 to release a probe card from the probe card receiving platform 308. Each clamping rod 312, 314, 316 is also capable of rotating about its axis, to align (or alternately lock) a T-shaped end 318, 320, 322 of the clamping rod 312, 314, 316 with a corresponding hole in a probe card.

FIG. 3 also illustrates an exemplary test electronics assembly 302, as it is being installed on the chassis 300. The particular manner in which the test electronics assembly 302 is installed on the chassis 300 is not relevant to this disclosure. However, as shown, the test electronics assembly 302 is installed at a right angle to the plane of the probe card receiving platform 308 (and thus, at a right angle to any probe card and wafer that are ultimately positioned on the probe card receiving platform 308). The core of the test electronics assembly 302 is a water block 324 that provides cooling for first and second test electronics boards mounted on opposite surfaces thereof. Only one of the test electronics boards 326 is viewable in FIG. 3, with the other test electronics board being positioned opposite the one shown, on the back side of the water block 324. Each test electronics board 326 comprises an input/output (I/O) connector 328 that facilitates communication with additional electronics in the test system, and a pair of I/O connectors 330, 332 that facilitate communication with one or more DUTs on a wafer. Each of the I/O connectors 330, 332 couples a test electronics board 326 to a corresponding DUT interface 334, which DUT interface 334 comprises a zero insertion force (ZIF) connector 336. Each DUT interface 334 (and its ZIF connector 336), in combination with 1) a set of cables, and 2) an additional connector that connect the ZIF connector to one of the I/O connectors 330, 332 (which cables and additional connector are not shown in FIG. 3), forms a "test electronics to DUT interface". As shown, the bodies of the ZIF connectors 336 (four of which are shown in FIG. 3) are mounted to the water block 324 adjacent the probe card receiving platform 308. When a probe card is positioned on the probe card receiving platform 308, the ZIF connectors 336 couple to the probe card to provide an electrical interface therebetween (and together with the probe card, the ZIF connectors 336 complete an electrical interface with the DUTs on a wafer).

As further shown in FIG. 3, the water block 324 of a test electronics assembly 302 is coupled to inlet and outlet pipes 338, 340, which inlet and outlet pipes 338, 340 couple the water block 324 to pipe fittings 342, 344 of respective "cool in" and "hot out" water manifolds 346, 348 on the chassis 300.

Figure 4:
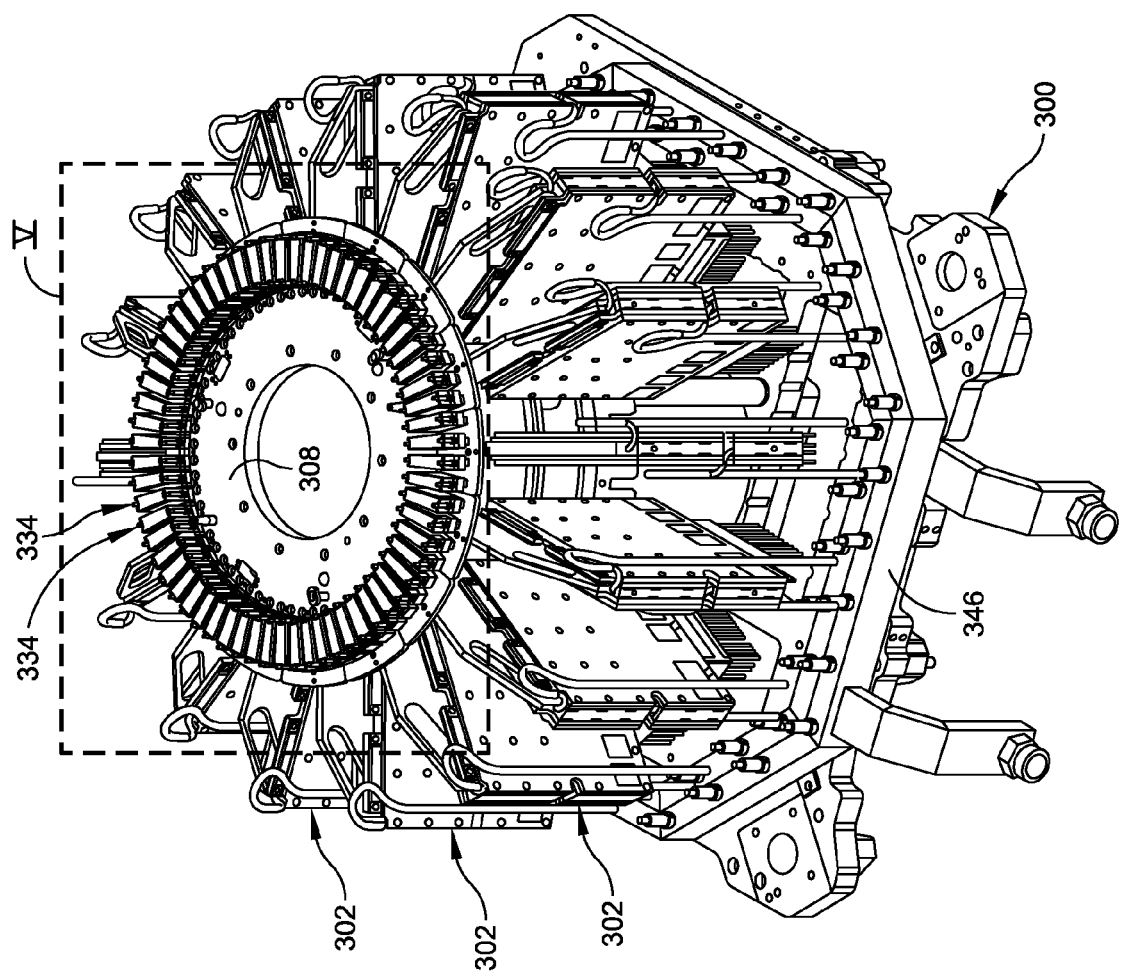
FIG. 4 illustrates the chassis shown in FIG. 3, after a plurality of the test electronics assemblies shown in FIG. 3 have been installed on the chassis.
Figure 5:
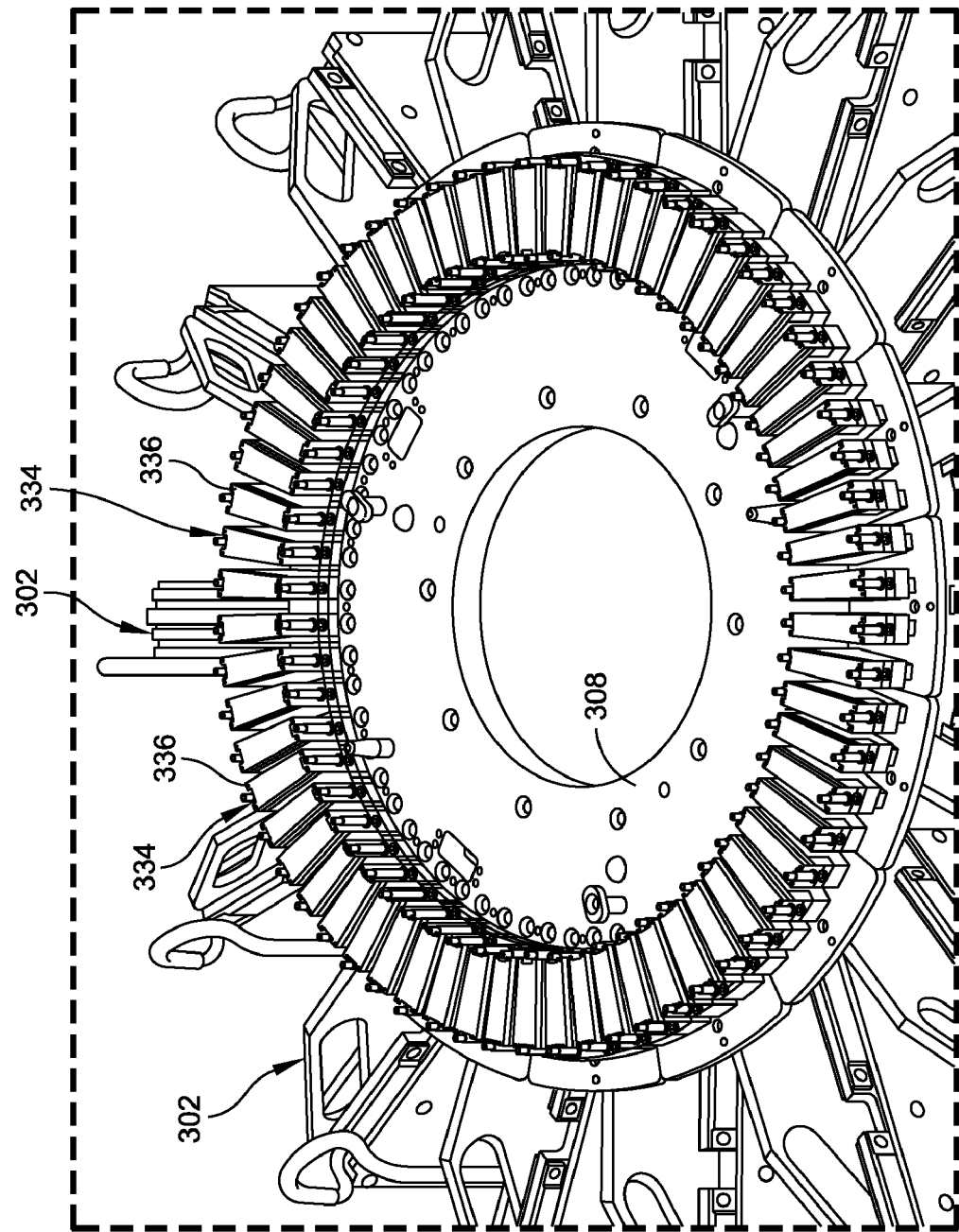
FIG. 5 provides an exploded view of the probe card receiving platform and ring of DUT interfaces shown in FIG. 4.

FIG. 4 illustrates the chassis 300 shown in FIG. 3, after a plurality of the test electronics assemblies 302 shown in FIG. 3 have been installed on the chassis 300. Note that the DUT interfaces 334 (and ZIF connectors 336) corresponding to each test electronics assembly 302 are positioned adjacent the DUT interfaces 334 (and ZIF connectors 336) of adjacent test electronics assemblies 302, thereby forming a ring of DUT interfaces 334 (and ZIF connectors 336) around the probe card receiving platform 308. FIG. 5 provides an exploded view of the probe card receiving platform 308 and ring of DUT interfaces 334 shown in FIG. 4 (including the ZIF connectors 336 of the DUT interfaces 334).

Figure 6:
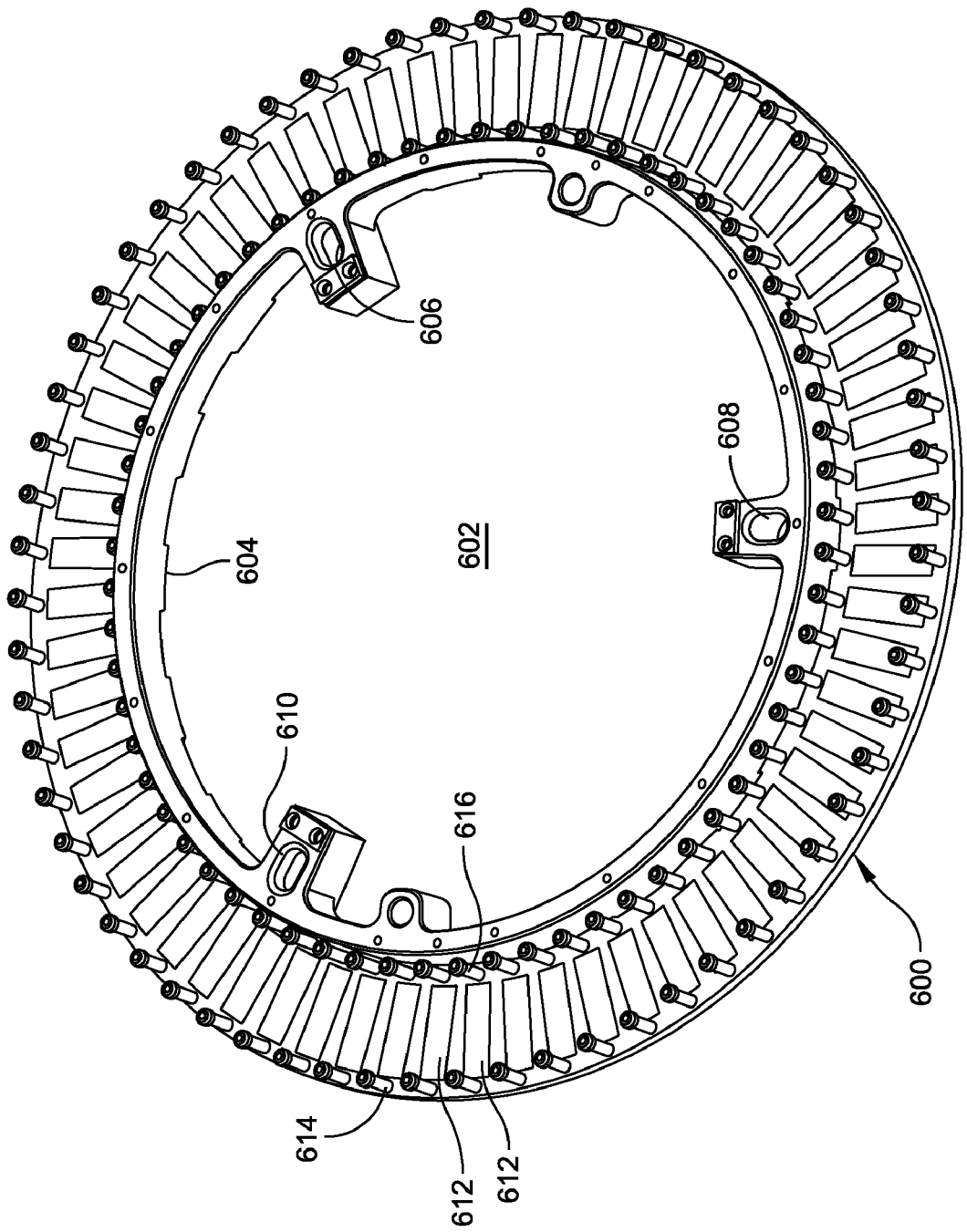
FIG. 6 illustrates an exemplary probe card, and in particular, the surface of the probe card that mates with the DUT interfaces and ZIF connectors shown in FIGS. 4 & 5.

FIG. 6 illustrates an exemplary probe card 600, and in particular, the surface 602 of the probe card 600 that mates with the DUT interfaces 334 (and their ZIF connectors 336) shown in FIGS. 4 & 5. Attached to the surface 602 of the probe card 600 is a stiffening ring 604. Formed in the stiffening ring 604 are the holes 606, 608, 610 that receive the T-shaped ends 318, 320, 322 of the clamping rods 312, 314, 316 shown in FIG. 3. Patterned on the surface 602 of the probe card 600 are arrays of electrical contacts 612 to which similarly-oriented arrays of electrical contacts provided by the ZIF connectors 336 electrically couple. Note that, in FIG. 6, each array of electrical contacts 612 is shown as a single rectangle representing the many electrical contacts of the array 612. In reality, each rectangle may comprise hundreds of individual electrical contacts. For example, in some embodiments, each array of electrical contacts 612 may comprise 418 contacts with an approximate 1 mm×1 mm pitch (though more or less contacts could be provided, with a pitch that is larger or smaller than 1 mm×1 mm).

Positioned at opposite ends of each array of electrical contacts 612 are first and second latching pins 614, 616, each of which may, in one embodiment, have a generally mushroom-like shape. As explained in more detail later in this description, each ZIF connector 336 comprises a "ZIF connector to DUT clamping mechanism" that engages a corresponding pair of the latching pins 614, 616. When the clamping mechanism is placed in its clamping mode, the clamping mechanism 1) exerts a first set of orthogonal forces to the probe card 600 by pulling the latching pins 614, 616 away from the surface 602 of the probe card 602, and 2) applies a second orthogonal force to the probe card 600 by pressing a DUT interface 334 (including its ZIF connector 336) against the probe card 600. When fully clamped, the orthogonal force applied to the probe card 600 by a DUT interface 334 is equal to (or at least substantially equal to) the set of orthogonal forces applied to the probe card 600 by its "ZIF connector to DUT clamping mechanism" pulling the latching pins 614, 616 away from the surface 602 of the probe card 600. Thus, the clamping of each ZIF connector 336 to the probe card 600 exerts a net zero force (or close to net zero force) on the probe card 600. As a result, deflection of the surface 602 of the probe card 600 is minimized. Another advantage of the ZIF connector to DUT clamping mechanism is that it does not require any DUT connectors to be installed on the probe card 600.

Figure 7:
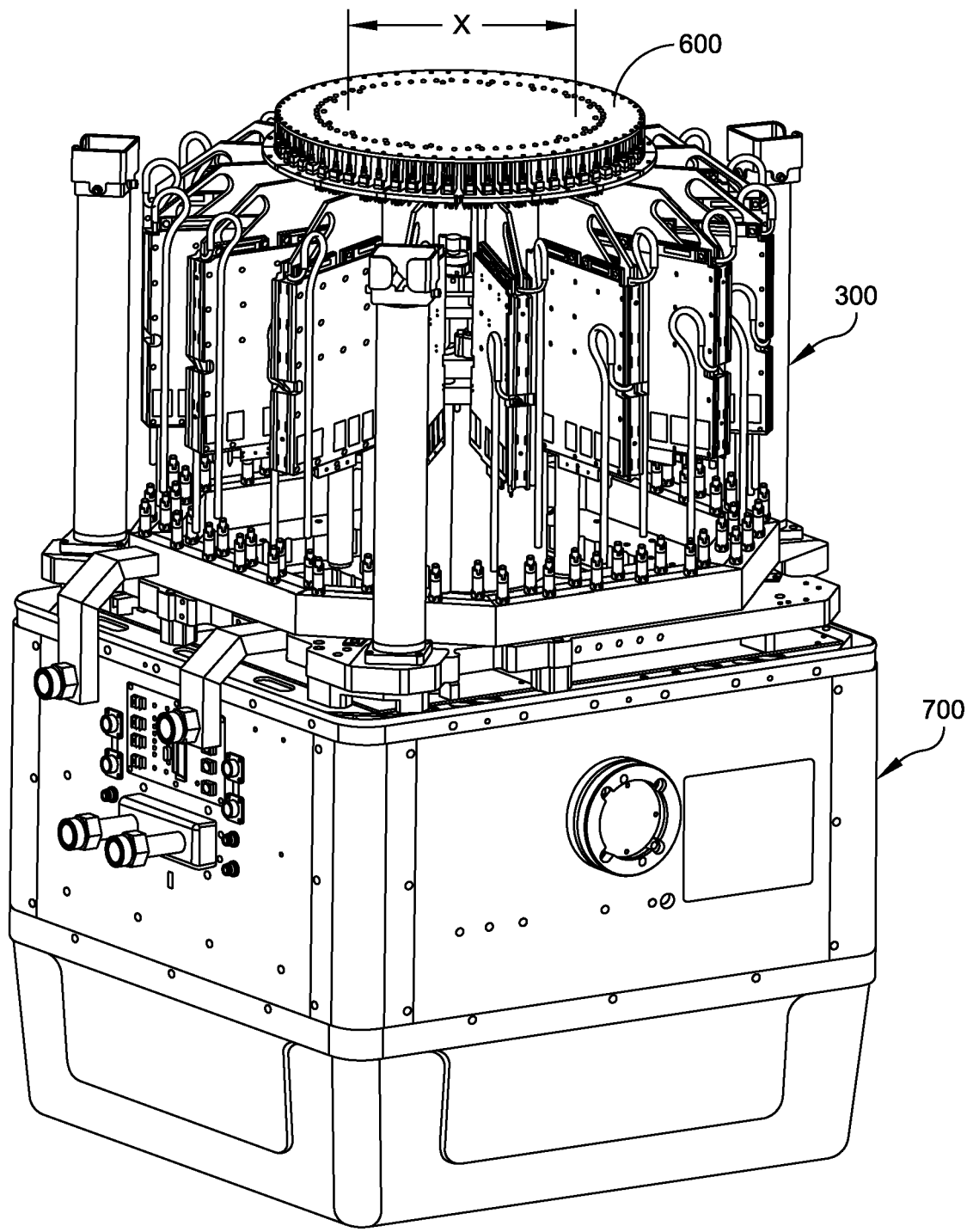
FIG. 7 illustrates the probe card shown in FIG. 6 after it has been positioned on the probe card receiving platform shown in FIG. 4.

FIG. 7 illustrates the probe card 600 after it has been positioned on the probe card receiving platform 308. Typically, a wafer is positioned in the area of the probe card 600 denoted by the diameter "x". FIG. 7 also illustrates how the chassis 300 may be coupled to a test head 700 of a test system.

Figure 8:
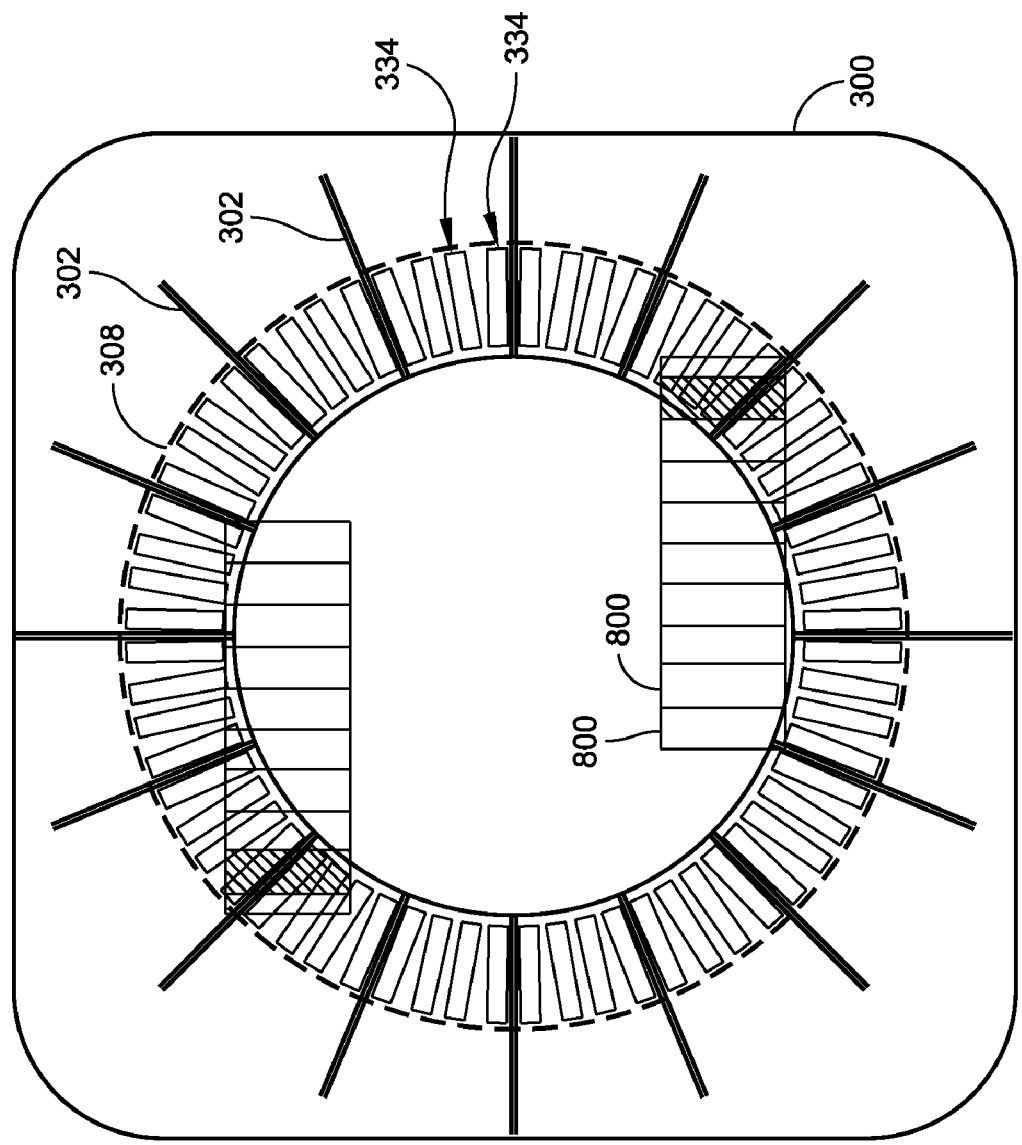
FIG. 8 illustrates a schematic plan view of the chassis shown in FIG. 7, along with the test electronics assemblies and DUT interfaces installed thereon.

FIG. 8 illustrates a schematic plan view of the chassis 300, along with the test electronics assemblies 302 and DUT interfaces 334 installed thereon. Also shown are a plurality of test electronics assemblies 800 in the test head on which the chassis 300 is mounted. The plurality of test electronics assemblies 302 may be respectively and electrically coupled to the electronics assemblies 800.

Figure 9:
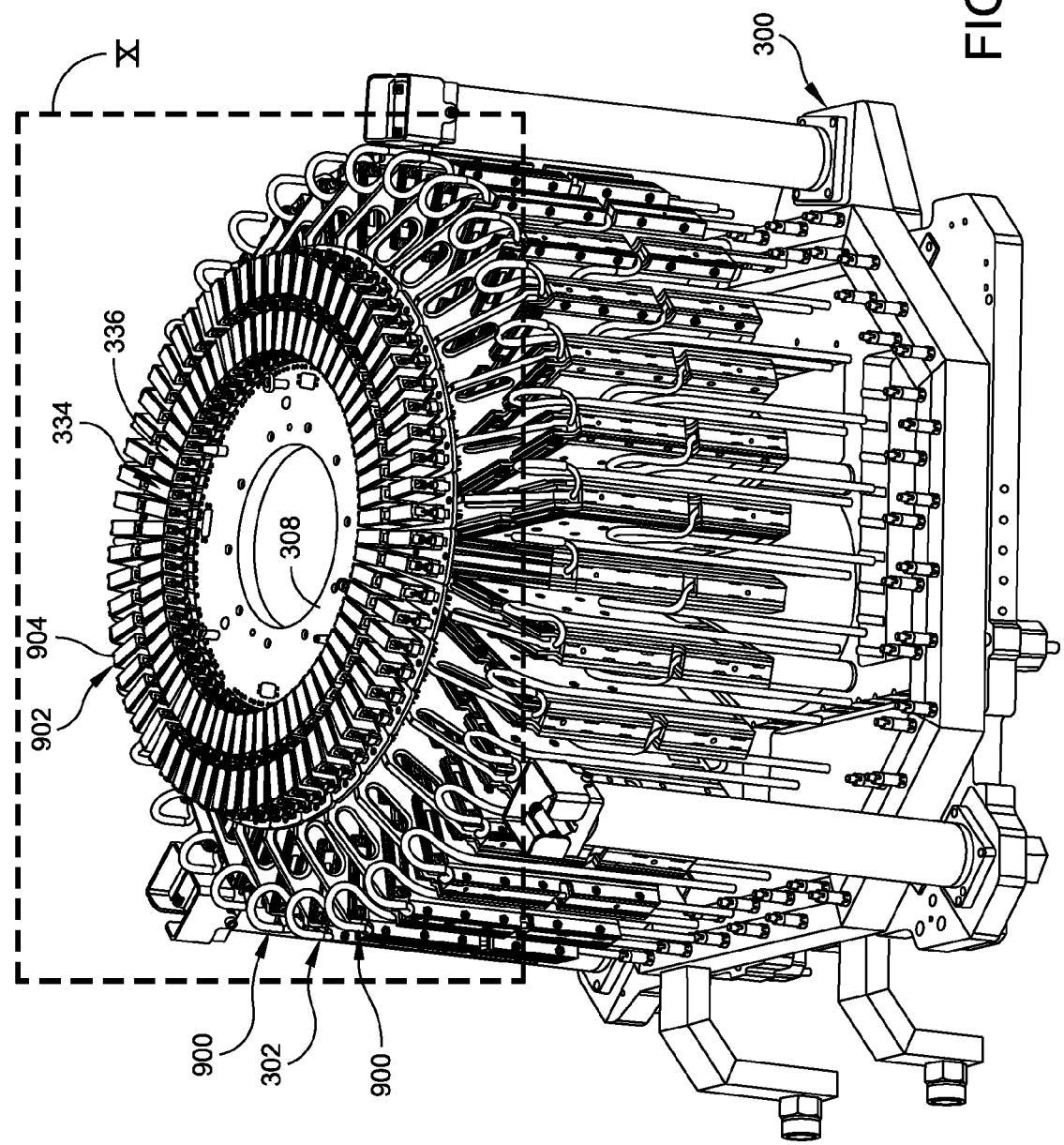
FIG. 9 illustrates the apparatus shown in FIG. 4, after a plurality of additional test electronics assemblies have been installed on its chassis, in between the test electronics assemblies shown in FIG. 4.
Figure 10:
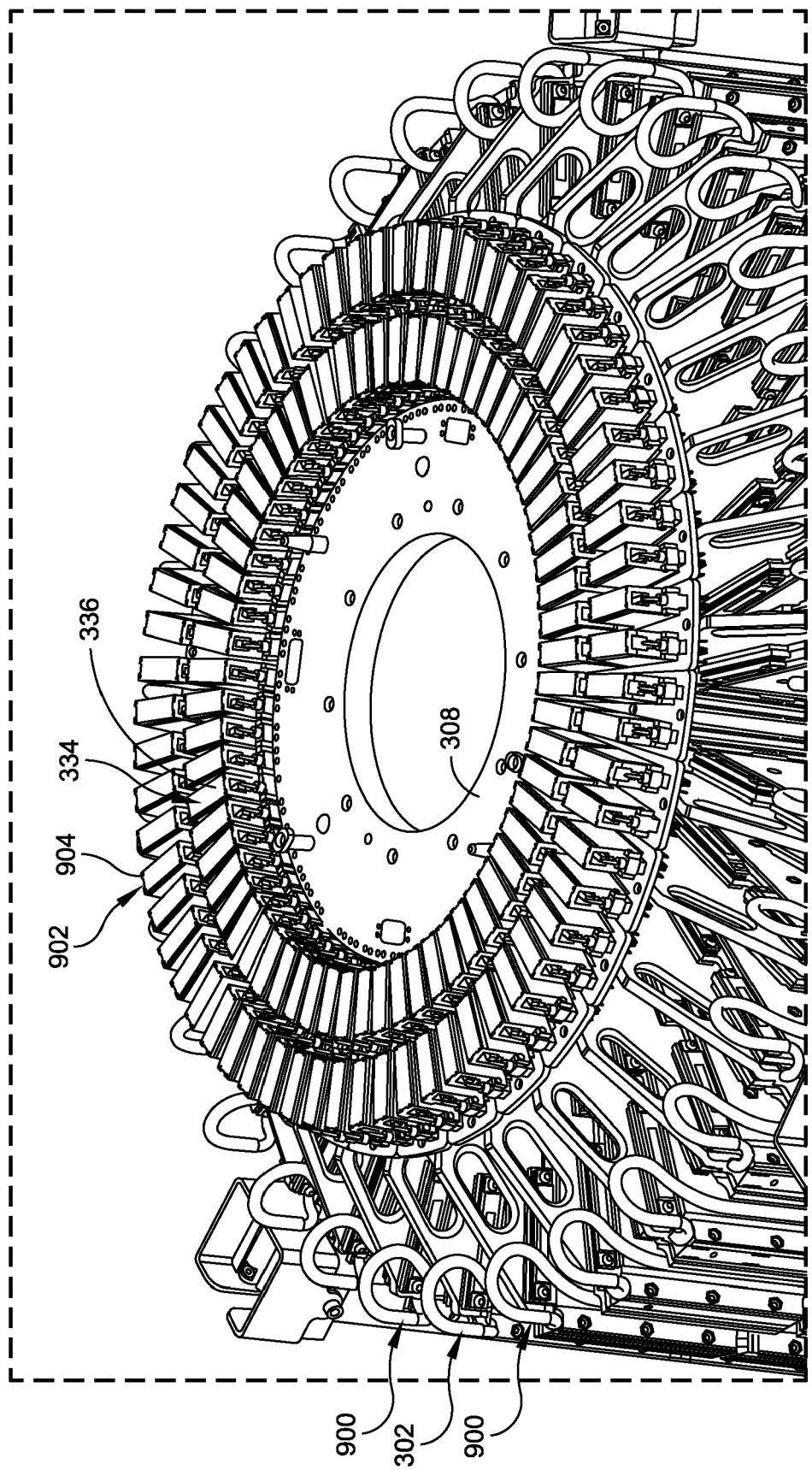
FIG. 10 provides an exploded view of the probe card receiving platform and concentric rings of DUT interfaces shown in FIG. 9.

FIG. 9 illustrates the apparatus shown in FIG. 4, after a plurality of additional test electronics assemblies 900 have been installed on the chassis 300, in between the test electronics assemblies 302 shown in FIG. 4. Note that the DUT interfaces 902 of the additional test electronics assemblies 900 (including their ZIF connectors 904) form a second ring of DUT interfaces 902 (and ZIF connectors 904), concentric with and exterior to the ring of DUT interfaces 334 (and ZIF connectors 336) formed by the DUT interfaces 334 of the test electronics assemblies 302 shown in FIG. 4. FIG. 10 provides an exploded view of the probe card receiving platform 308 and concentric rings of DUT interfaces 334, 902 (and ZIF connectors 336, 904).

Figure 11:
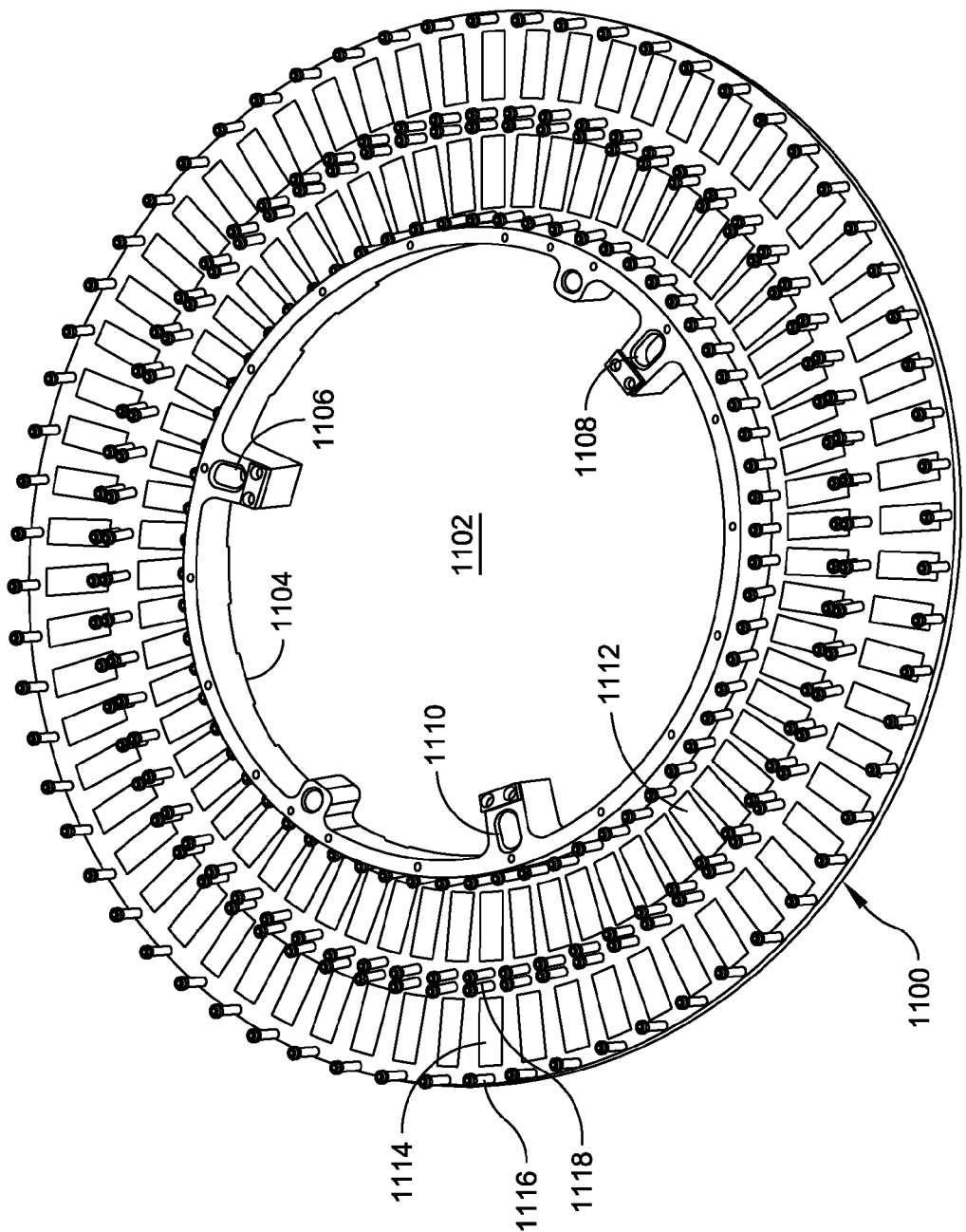
FIG. 11 illustrates an exemplary probe card, and in particular, the surface of the probe card that mates with the DUT interfaces and ZIF connectors shown in FIGS. 9 & 10.

FIG. 11 illustrates an exemplary probe card 1100, and in particular, the surface 1102 of the probe card 1100 that mates with the DUT interfaces 334, 902 (and their respective ZIF connectors 336, 904) shown in FIGS. 9 & 10. Attached to the surface 1102 of the probe card 1100 is a stiffening ring 1104. Formed in the stiffening ring 1104 are the holes 1106, 1108, 1110 that receive the T-shaped ends 318, 320, 322 of the clamping rods 312, 314, 316 (shown in FIG. 3). Patterned on the surface 1102 of the probe card 1100 are arrays of electrical contacts 1112, 1114 to which similarly-oriented arrays of electrical contacts provided by the ZIF connectors 336, 904 electrically couple. Note that, in FIG. 11, each array of electrical contacts 1112, 1114 is shown as a single rectangle representing the many electrical contacts of the array 1112, 1114. In reality, each rectangle may comprise hundreds of individual electrical contacts.

In contrast to the arrays of electrical contacts 612 shown in FIG. 6, the arrays of electrical contacts 1112, 1114 shown in FIG. 11 are positioned along the perimeters of first and second concentric rings—for mating with respective DUT interfaces 334, 902 that are positioned along the perimeters of first and second concentric rings, as shown in FIGS. 9 & 10. Positioned at opposite ends of each array of electrical contacts 1112, 1114 are first and second latching pins, such as pins 1116 and 1118. As explained in more detail later in this description, each ZIF connector 336, 904 comprises a "ZIF connector to DUT clamping mechanism" that engages a corresponding pair of the latching pins 1116, 1118.

Figure 12:
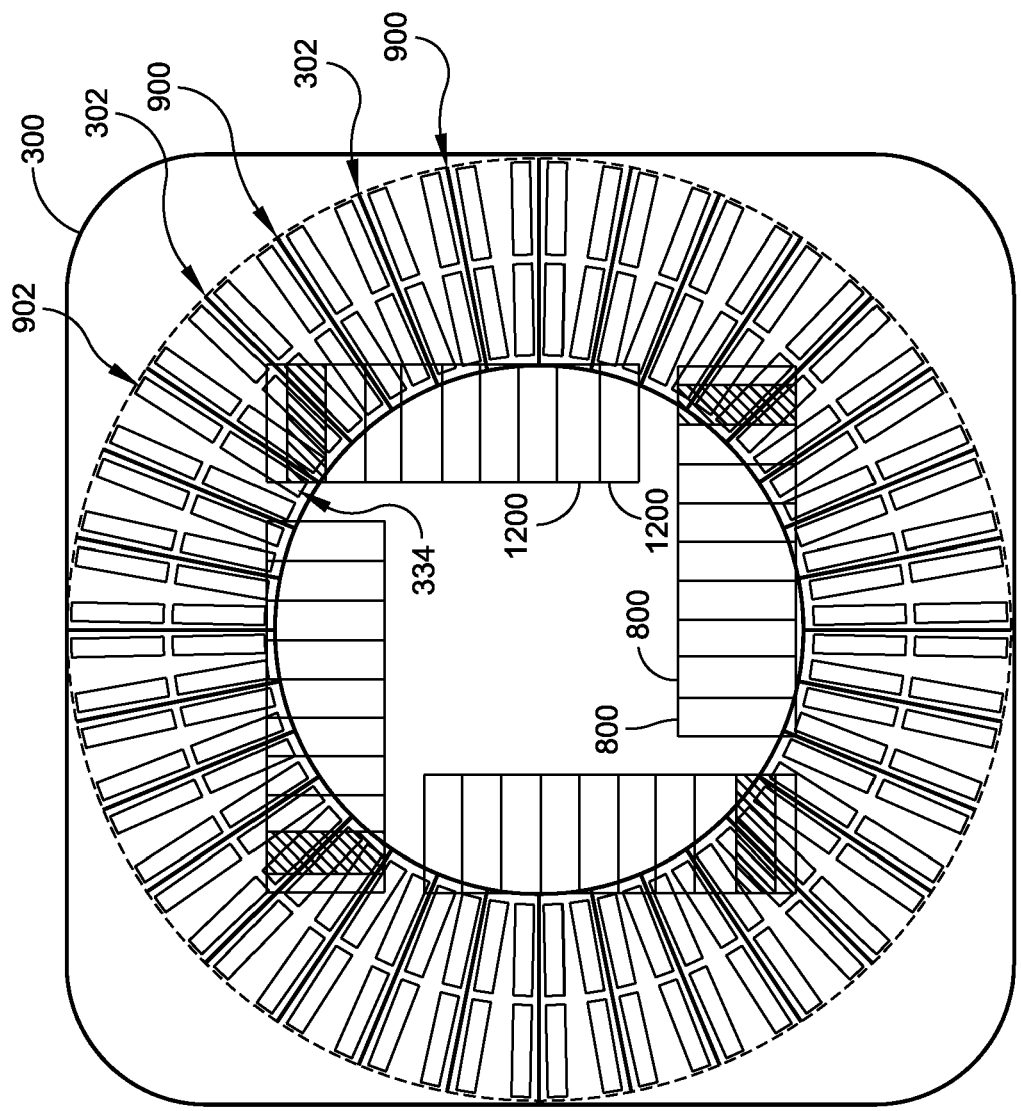
FIG. 12 illustrates a schematic plan view of the chassis shown in FIG. 7, after it has been upgraded to include the additional test electronics assemblies and corresponding DUT interfaces shown in FIG. 9.

FIG. 12 illustrates a schematic plan view of the chassis 300 shown in FIG. 7, after it has been upgraded to include the additional test electronics assemblies 900 and corresponding DUT interfaces 902 shown in FIG. 9. Also shown are additional electronic assemblies 1200 in the test head on which the chassis 300 is mounted. The additional test electronics assemblies 900 may be coupled to the additional electronic assemblies 1200.

Although FIGS. 9-12 show first and second subsets of DUT interfaces 334, 902 positioned along the respective perimeters of first and second circles, first and second subsets of DUT interfaces 334, 902 could also be positioned along the perimeters of other concentric shapes, such as ovals, squares or rectangles (to name a few). First and second subsets of DUT interfaces 334, 902 can also be positioned along the respective perimeters of different concentric shapes, such as a square that surrounds a circle. Such an arrangement might, in some cases, facilitate the use of both different sizes and different shapes of probe cards in a single test system (although it would also be possible to couple a circular ring of DUT interfaces to a square probe card, for example).

As one can appreciate after reading the above disclosure, the construction of the chassis 300 shown in FIG. 3, coupled with the modular nature of the test electronics assemblies 302, 900 shown in FIGS. 4 & 9, enables the I/O capacity of a "test electronics to DUT interface" to be doubled in a modular fashion. Doubling the I/O capacity does, however, require the use of a larger diameter probe card 1100, which probe card 1100 provides arrays of electrical contacts 1112, 1114 in first and second rings. In one embodiment, the diameter of the probe card 600 accepted by the apparatus shown in FIG. 4 may be 450 millimeters (mm), and the diameter of the probe card 1100 accepted by the apparatus shown in FIG. 9 may be 560 mm.

Figure 13:
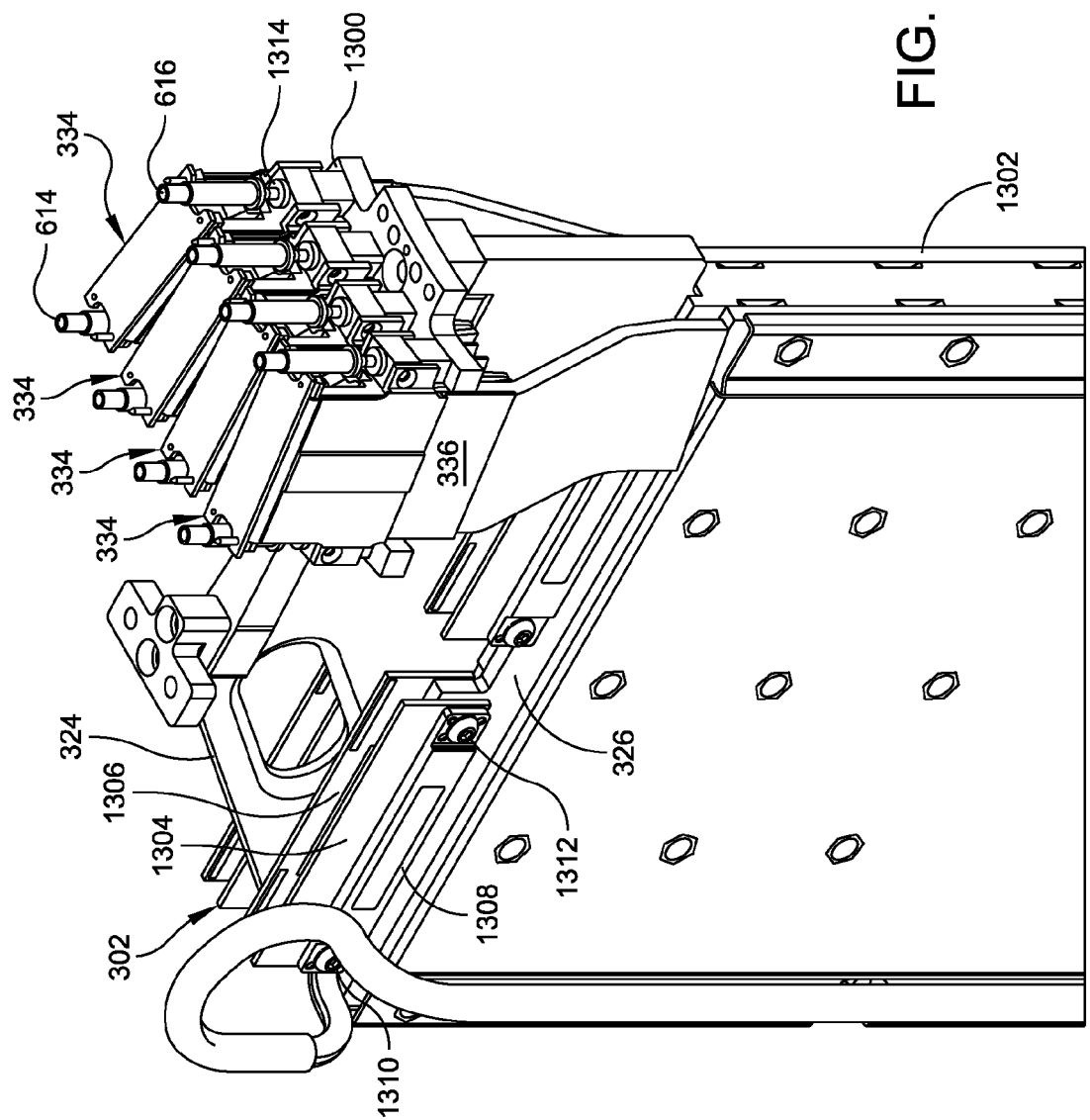
FIGS. 13 & 14 illustrate respective exploded views of the DUT interfaces and ZIF connector arrangements of 1) one of the test electronics assemblies shown in FIG. 4, and 2) one of the additional test electronics assemblies shown in FIG. 9.
Figure 14:
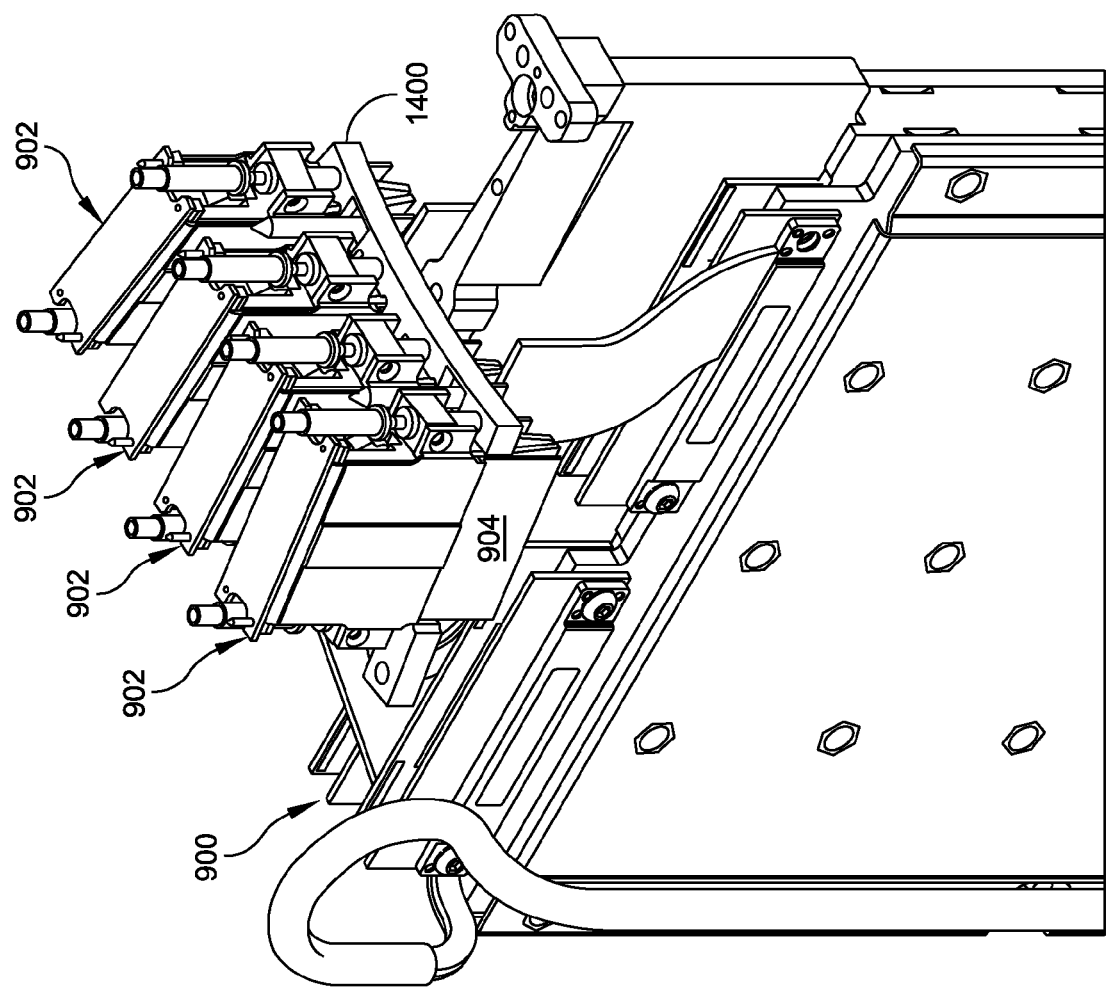

FIGS. 13 & 14 illustrate respective exploded views of the DUT interfaces 334, 902 and ZIF connector arrangements of 1) one of the test electronics assemblies 302 shown in FIG. 4, and 2) one of the additional test electronics assemblies 900 shown in FIG. 9. For purposes of this disclosure, the only difference between the FIG. 13 and FIG. 14 test electronics assemblies 302, 900 is the position of the platforms 1300, 1400 that support their respective ZIF connectors 336, 904. That is, the platform 1300 shown in FIG. 13 is configured to position its ZIF connectors 336 in the inner ring of ZIF connectors on the chassis 300 (see FIG. 9), and the platform 1400 shown in FIG. 14 is configured to position its ZIF connectors 904 in the outer ring of ZIF connectors on the chassis 300.

Given the similarities of what is shown in FIGS. 13 & 14, only what is shown in FIG. 13 is described in further detail. One of ordinary skill in the art will readily understand how the description of FIG. 13 applies to what is shown in FIG. 14. That said, FIG. 13 shows the test electronics assembly 302, its water block 324, a test electronics board 326, 1302 mounted on each side of the water block 324, and one of the I/O connectors 330 on the test electronics board 326. Also shown is a pair of paddle board PCBs 1304, 1306 sandwiching each I/O connector 330, and an insulating bolster plate 1308 and two screws 1310, 1312 that, along with a surface of the water block 324, clamp the PCBs 1304, 1306 to the I/O connector 330. How the PCBs 1304, 1306 are coupled to the I/O connector 330 will be described in more detail later in this description.

FIG. 13 also provides a detailed view of the DUT interfaces 334 positioned on the platform 1300, which platform 1300 is mounted on the water block 324. In addition to a ZIF connector 336 having a "ZIF connector to DUT clamping mechanism" integrated therewith, each DUT interface 334 comprises a DUT interposer 334 that provides a good quality connection between electrical contacts on the ZIF connector 336 and a probe card 600. A pair of alignment pins, including pin 1314, is attached to the housing or frame of each ZIF connector 336. FIG. 13 also shows the latching pins 614, 616 of a probe card, aligned with the alignment pins. For example, latching pin 616 is aligned with, and receives, alignment pin 1314.

Figure 15:
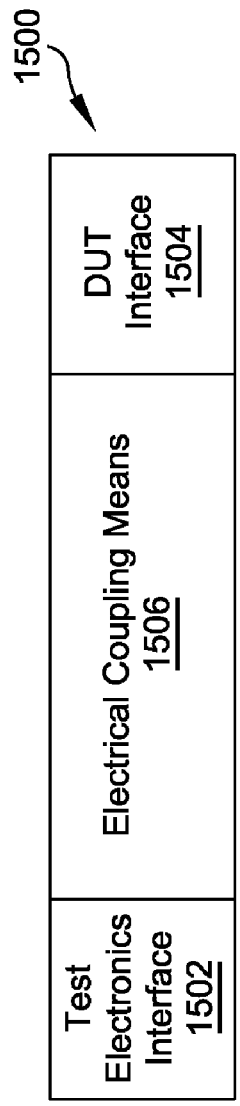
FIG. 15 illustrates, in block form, an exemplary "test electronics to DUT interface" for electrically coupling one of the test electronics assemblies shown in FIG. 13 or 14 to a DUT.

FIG. 15 illustrates, in block form, an exemplary "test electronics to DUT interface" 1500 for electrically coupling one of the test electronics assemblies 302, 900 shown in FIG. 13 or 14 to a DUT. In the wafer sort application described so far, the test electronics to DUT interface 1500 couples a test electronics assembly 302 to a plurality of DUTs on a wafer, via a probe card 600 or 1100. As shown, the interface 1500 comprises a test electronics interface 1502, a DUT interface 1504, and a means 1506 for coupling the test electronics and DUT interfaces 1502, 1504. In some embodiments, the means 1506 for coupling the test electronics and DUT interfaces 1502, 1504 may comprise a plurality of coaxial cables. Alternatively, the means 1506 for coupling the test electronics and DUT interfaces 1502, 1504 may comprise a flex circuit or other electrical connection.

Figure 16:
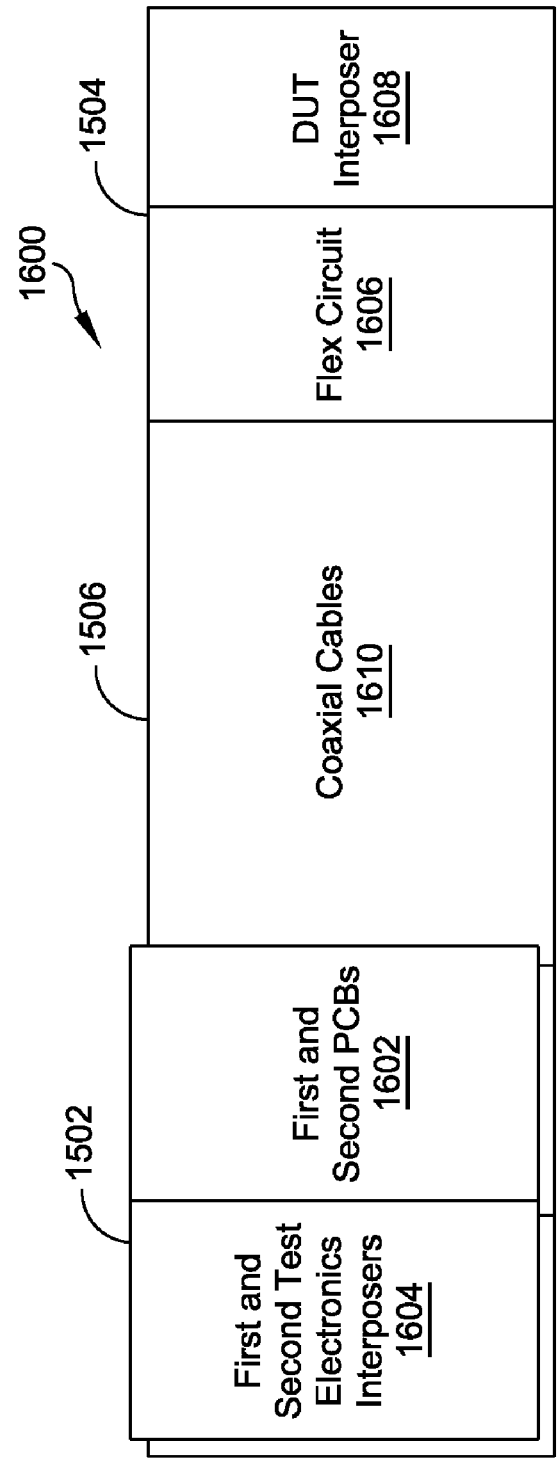
FIGS. 16-19 illustrate an exemplary more detailed implementation of the test electronics to DUT interface shown in FIG. 15.
Figure 17:
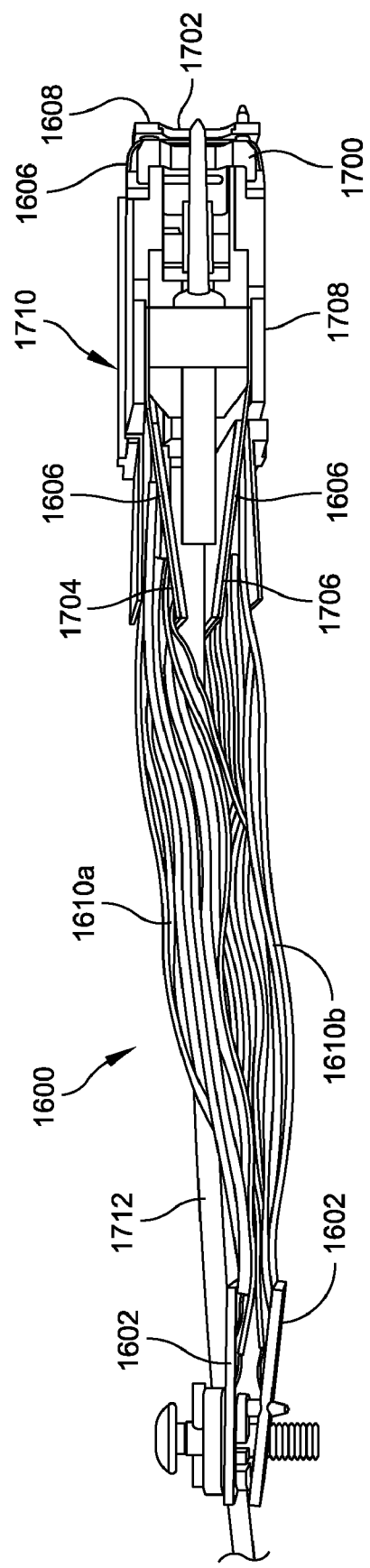

FIGS. 16 & 17 illustrate an exemplary more detailed implementation 1600 of the test electronics to DUT interface 1500 shown in FIG. 15. In the exemplary implementation, the test electronics interface 1502 comprises at least one printed circuit board (PCB) and at least one test electronics interposer. However, by way of example, FIGS. 16 & 17 show an interface comprised of first and second PCBs 1602 and first and second test electronics interposers 1604. To increase the density of signal routes through the PCBs 1602, each PCB may be a multi-layer PCB. To enable higher quality signal transmissions, electrical paths on (or in) the PCBs 1602 may be constructed as controlled impedance transmission line paths, such as stripline paths.

Each of the test electronics interposers 1604 has a first side and a second side. The first side of each test electronics interposer 1604 has a first plurality of electrical contacts thereon. The first plurality of electrical contacts is electrically coupled to a respective one of the PCBs 1602. The second side of each test electronics interposer 1604 has a second plurality of electrical contacts thereon. The second plurality of contacts provides an electrical coupling to a test electronics assembly 302 or 900.

In FIG. 16, the DUT interface 1504 comprises a flex circuit 1606 and a DUT interposer 1608. The flex circuit 1606 has 1)

a plurality of electrical contacts on a surface thereof, and 2) a plurality of electrical signal paths that are coupled to the plurality of electrical contacts. To achieve maximum density, the electrical signal paths may be formed on both sides of the flex circuit 1606, and the flex circuit 1606 may be a multi-layer flex circuit. To enable higher quality signal transmissions, the electrical signal paths may be constructed as controlled impedance transmission line paths, such as stripline paths. The DUT interposer 1608 has a first side and a second side. The first side of the DUT interposer 1608 has a first plurality of electrical contacts thereon. The first plurality of electrical contacts is coupled to the plurality of electrical contacts of the flex circuit 1606. The second side of the DUT interposer 1608 has a second plurality of electrical contacts thereon. The second plurality of electrical contacts is coupled to the first plurality of electrical contacts and provides an electrical coupling to a DUT (or probe card 600 or 1100).

The means 1506 for coupling the test electronics and DUT interfaces 1502, 1504 comprises a plurality of coaxial cables 1610, coupled between the first and second PCBs 1602 and the electrical signal paths of the flex circuit 1606. The first and second PCBs 1602 electrically couple the plurality of coaxial cables 1610 to the test electronics interposers 1604. The coaxial cables 1610 provide controlled impedance transmission line paths between the test electronics interface 1502 and the DUT interface 1504.

FIG. 17 illustrates how the flex circuit 1606 may be looped around a flex circuit form 1700 (which flex circuit form may in some cases be a compliant flex circuit form). The flex circuit 1606 is looped around the flex circuit form 1700 with a first surface of the flex circuit 1606 facing the flex circuit form 1700. A second surface of the flex circuit 1606, opposite the first surface, has the plurality of electrical contacts 1702 that interface with the DUT interposer 1608 thereon. At least part of the flex circuit 1606 may be encased within a connector housing 1708. In some embodiments, the connector 1710 may be a ZIF connector having an integrated "ZIF connector to DUT clamping mechanism". An exemplary operation of such a "ZIF connector to DUT clamping mechanism" is described later in this description. In some cases, the ZIF connector to DUT clamping mechanism may comprise a pneumatically actuated clamping system, which system is pneumatically activated via air received through a tube or pipe 1712 (see, FIGS. 17-19). First and subsets of the plurality of coaxial cables 1610a, 1610b may be respectively coupled to first and second opposing ends 1704, 1706 of the flex circuit 1606.

Figure 19:
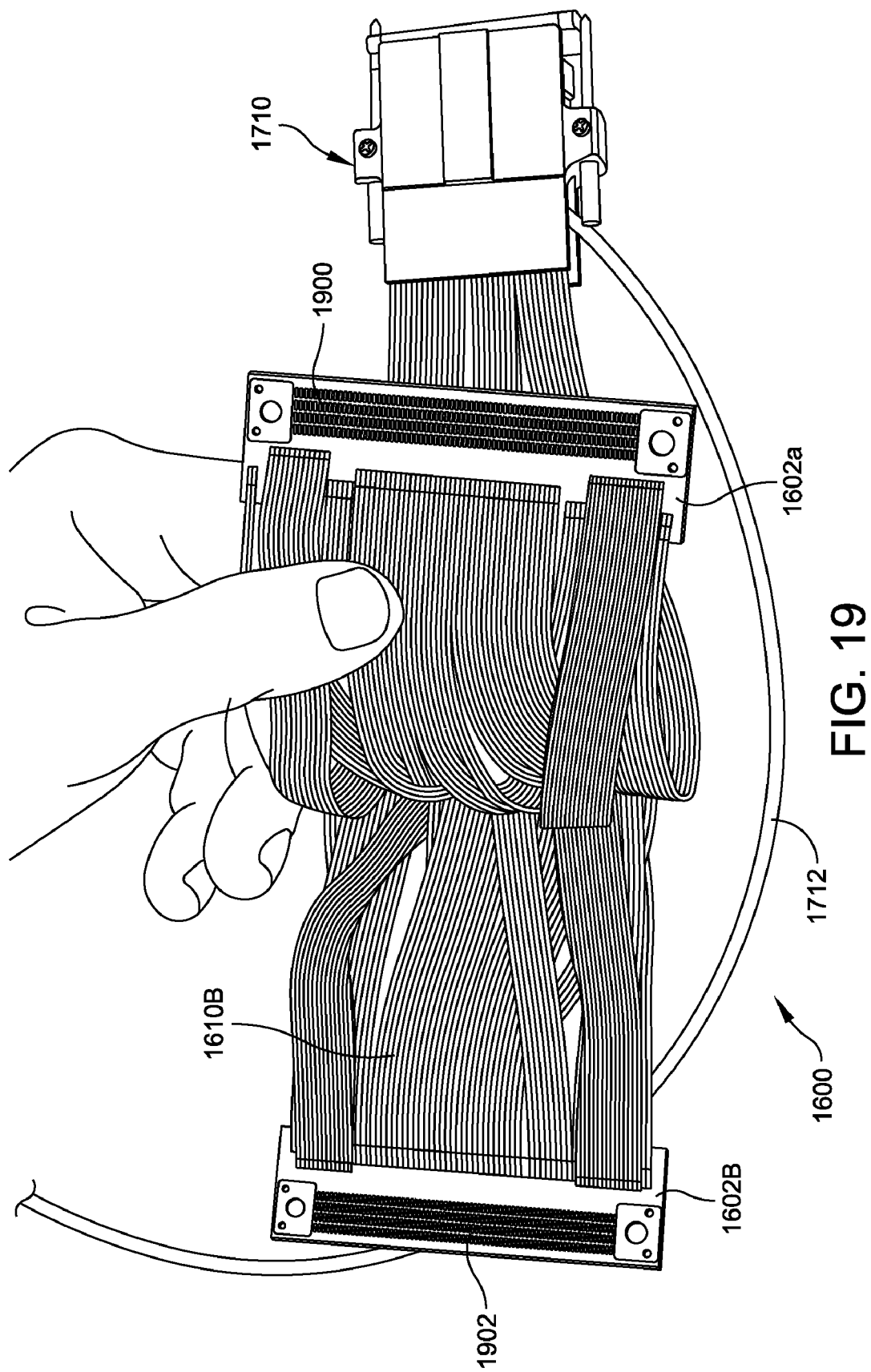

FIG. 19 illustrates the test electronics to DUT interface 1600 after having bent one subset 1610a of the coaxial cables to reveal the inside faces (and sets of electrical contacts 1900, 1902) of the first and second PCBs 1602a, 1602b. In one embodiment, each of the PCBs 1602a, 1602b may be coupled to 72 high speed pin electronics (PE) sub-channels on the test electronics assembly 302 or 900, with different subsets of the PE sub-channels being derived from thirty-six primary PE channels (i.e., the test electronics assembly provides a 1:4 fan-out of primary PE channels to PE sub-channels). Additional electrical contacts on the PCB 1602a or 1602b may be coupled to, for example, 44 signals comprised of low speed control channels, utility channels, DC power supply lines, DC sense lines, and 132 ground returns. All of these signals/channels may, in turn, be routed from one of the PCBs 1602a to the ZIF connector 1710; and the other PCB 1602b may route the same complement of signals to the ZIF connector 1710. In this manner, each PCB 1602a, 1602b routes 116 signals plus 132 ground returns. The total number of signals routed to each ZIF connector 1710 is therefore 418, including 232 signals (116 from each PCB) and a reduced number of ground returns (i.e., 186 ground returns). However, the number of signals routed through a PCB 1602a, 1602b or ZIF connector 1710 may vary, depending on the application.

Figure 20:
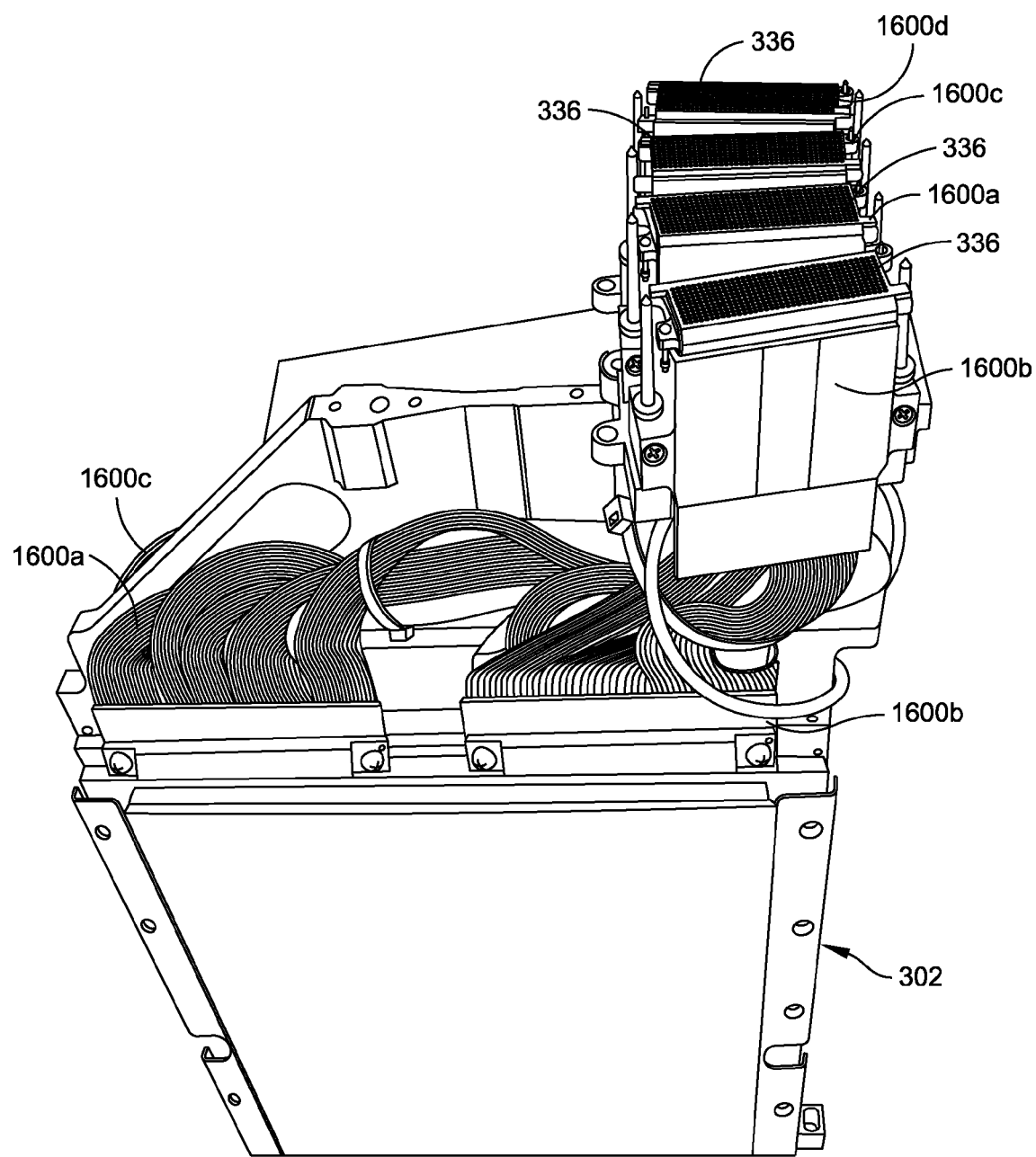
FIGS. 20 & 21 respectively illustrate how a plurality of the test electronics to DUT interfaces may be used to electrically couple a test electronics assembly to a set of ZIF connectors.
Figure 21:
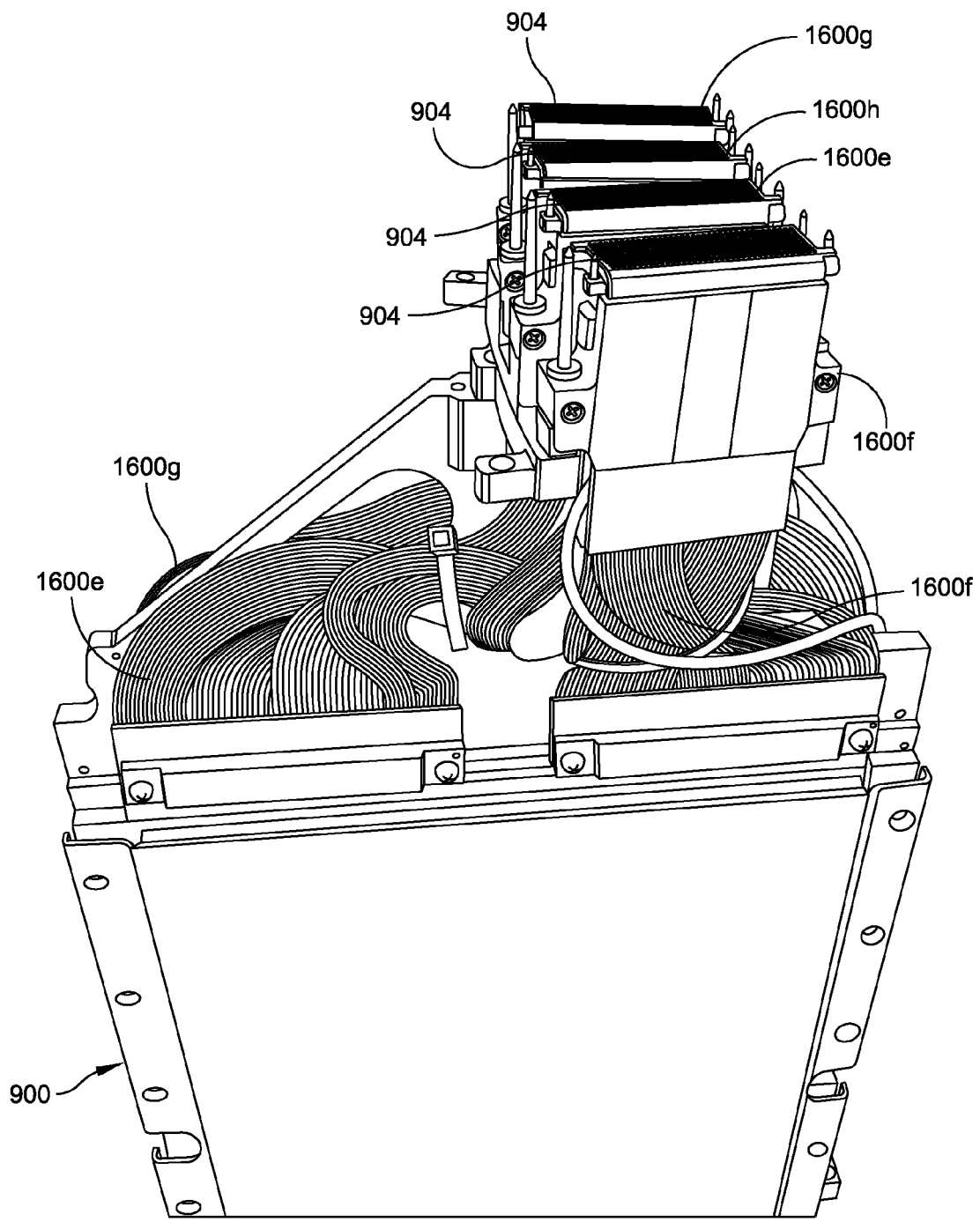

FIGS. 20 & 21 respectively illustrate how a plurality of the test electronics to DUT interfaces 1600a, 1600b, 1600c, 1600d (or 1600e, 1600f, 1600g, 1600h) may be used to electrically couple a test electronics assembly 302 or 900 to a set of ZIF connectors 336 or 904. FIG. 20 illustrates how a plurality of test electronics to DUT interfaces 1600a, 1600b, 1600c, 1600d may be used to couple the test electronics assembly 302 and ZIF connectors 336 shown in FIG. 13; and FIG. 21 illustrates how a plurality of test electronics to DUT interfaces 1600e, 1600f, 1600g, 1600h may be used to couple the test electronics assembly 900 and ZIF connectors 904 shown in FIG. 14.

Figure 18:
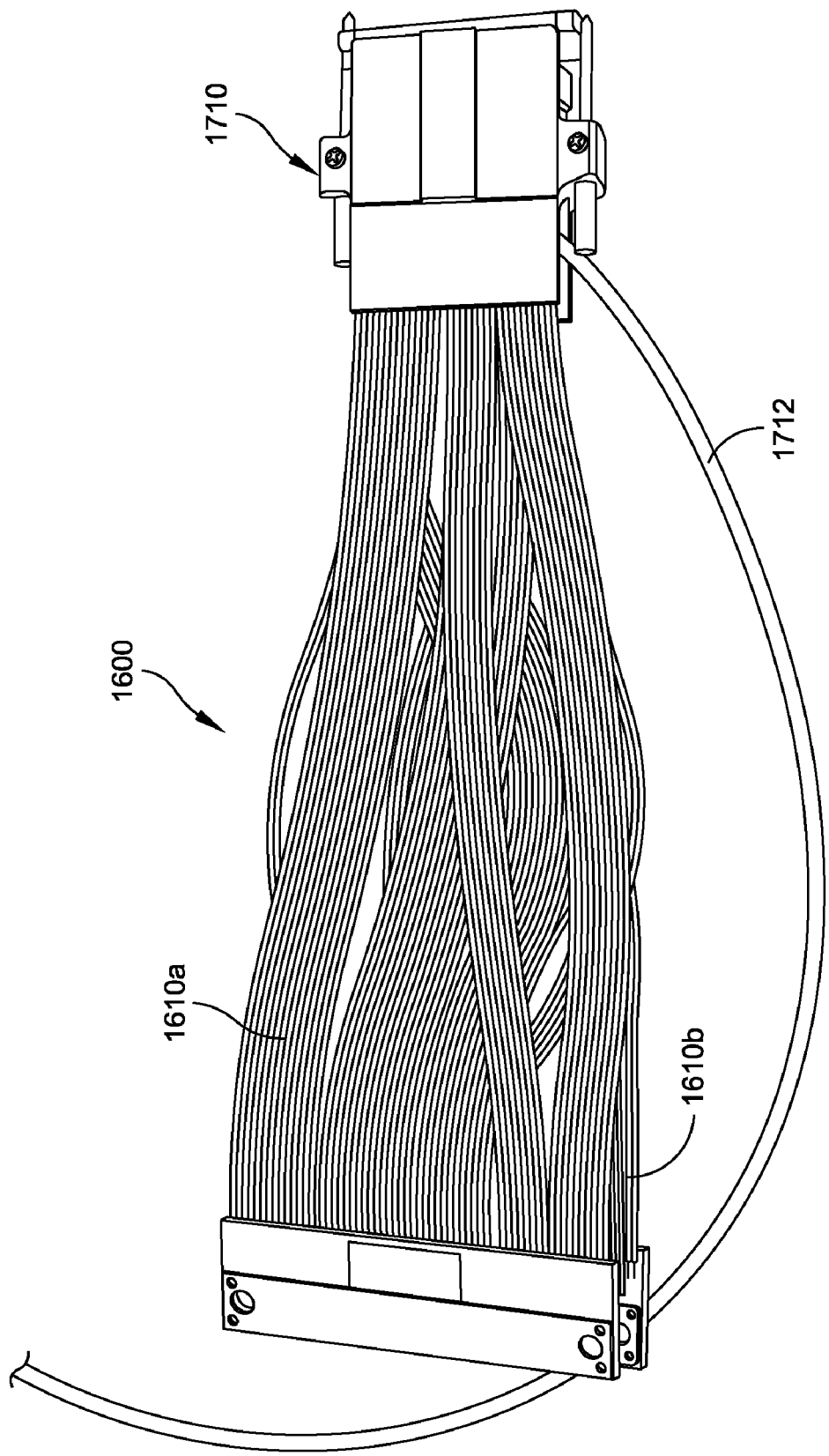
Figure 22:
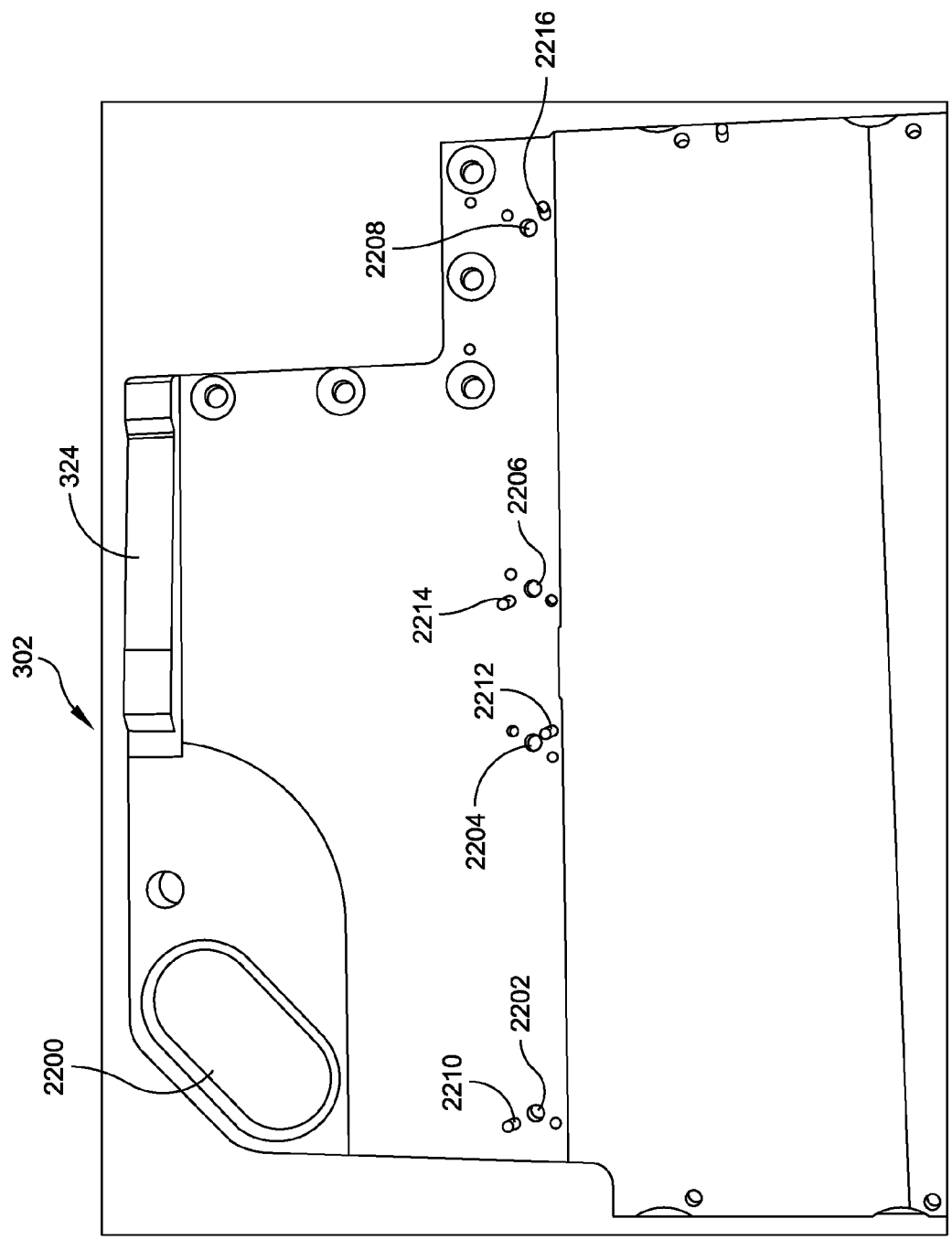
FIGS. 22-28 illustrate how the test electronics interface of the "test electronics to DUT interface" shown in FIGS. 17-19 may be coupled to a test electronics board of one of the test electronics assemblies shown in FIG. 13 or 14.

FIGS. 22-28 illustrate how the test electronics interface 1502 of the "test electronics to DUT interface" 1600 shown in FIGS. 17-19 may be coupled to a test electronics board 326 of one of the test electronics assemblies 302 shown in FIG. 13 or 14. To begin, FIG. 22 illustrates a portion of a bare water block 324 of one of the test electronics assemblies 302. As shown, the water block 324 may comprise a handle 2200 for grabbing hold of the test electronics assembly 1302. The water block 324 may also comprise a plurality of holes 2202, 2204, 2206, 2208 via which components may be bolted (or screwed) to the water block 324, and a plurality of pins 2210, 2212, 2214, 2216 for aligning components with the water block 324.

Figure 23:
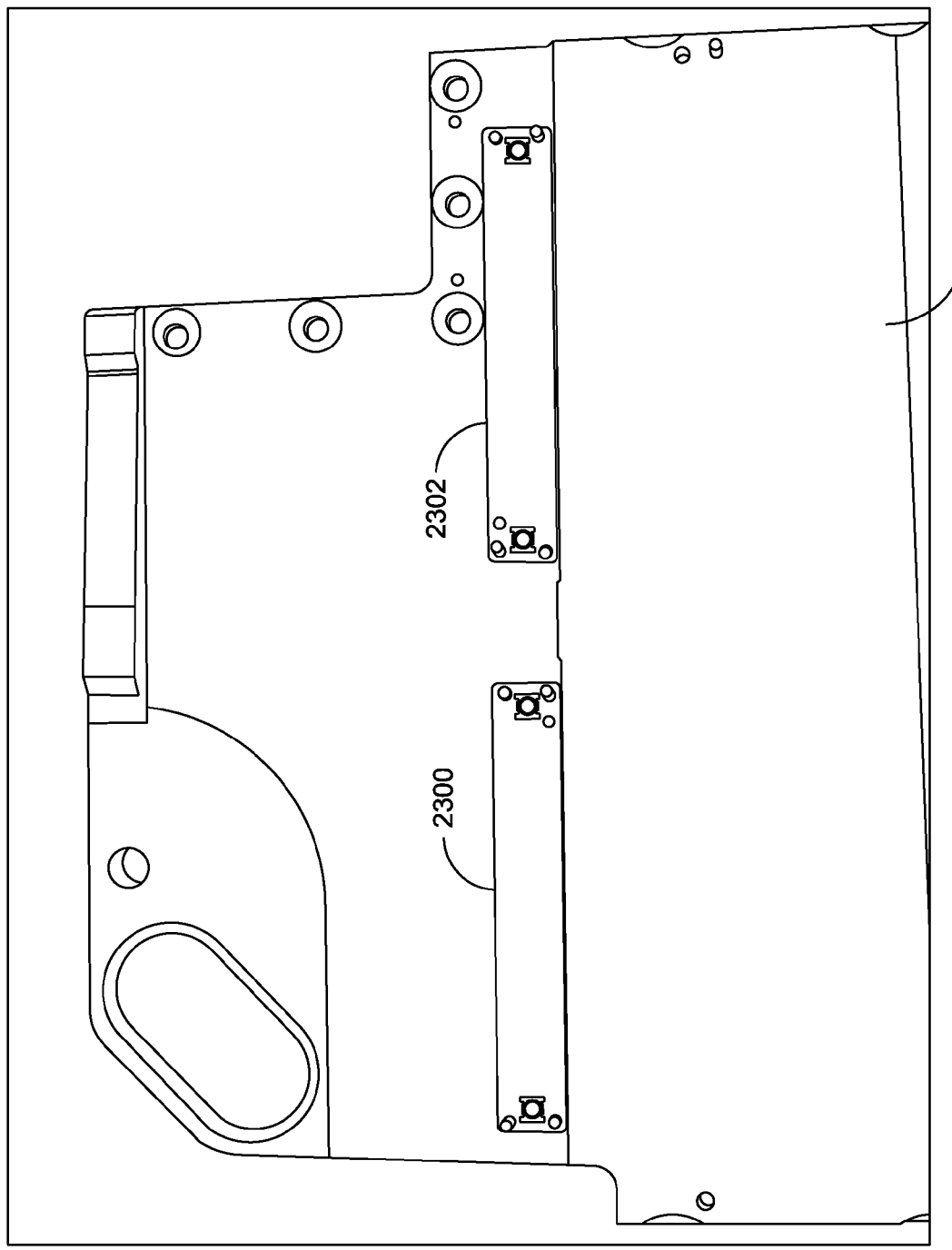

FIG. 23 illustrates the placement of two insulator pads 2300, 2302 on the water block 324. The use of insulator pads 2300, 2302 is optional, but may be necessary to insulate PCB contacts (or traces) from a metallic water block 324. Each of the insulator pads 2300, 2302 may comprise holes for receiving corresponding alignment pins 2210, 2212, 2214, 2216 on the water block 324.

Figure 24:
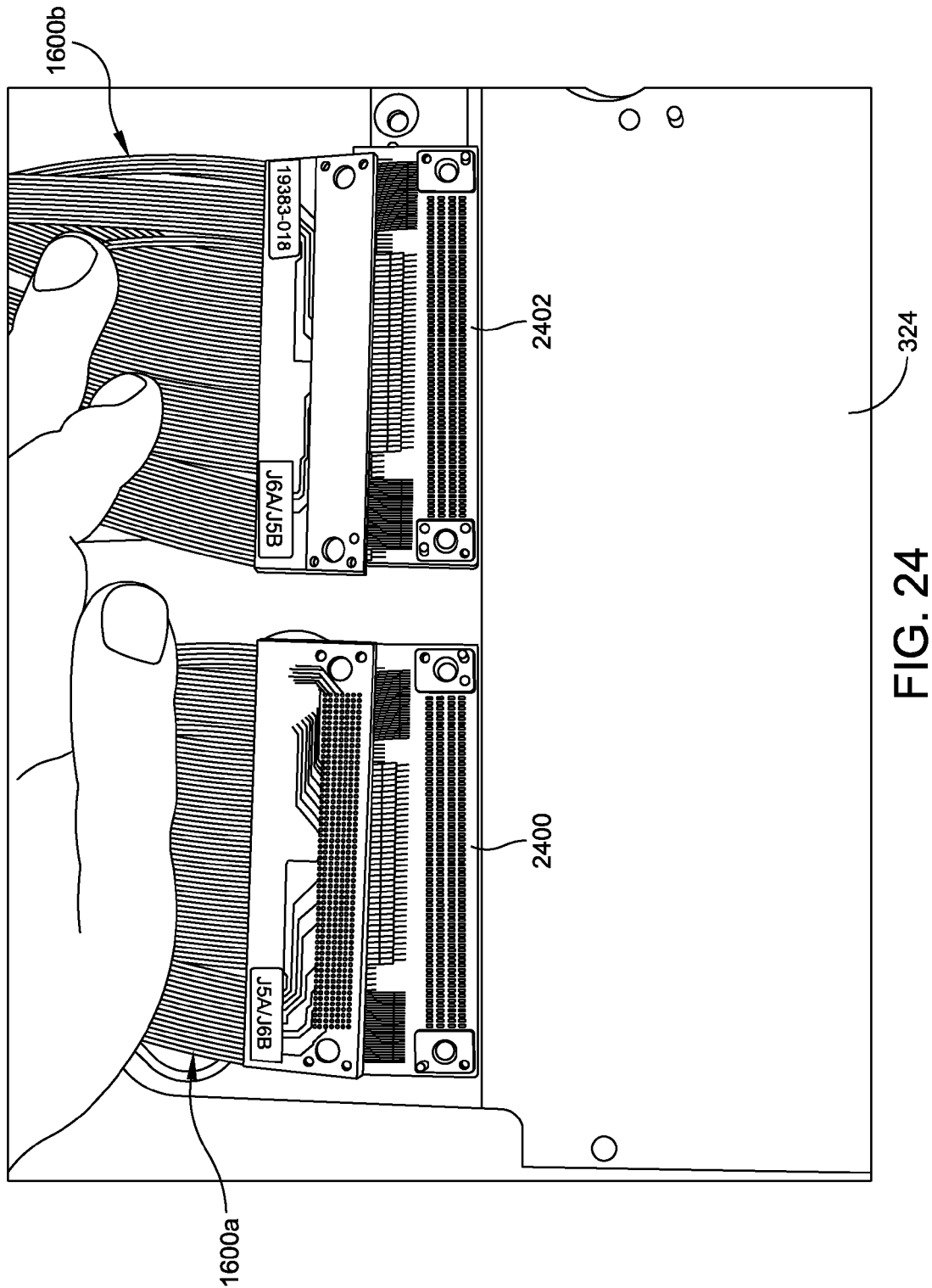

FIG. 24 illustrates how the first PCBs 2400, 2402 of two different "test electronics to DUT interfaces" 1600a, 1600b are aligned with, and positioned over, the two insulator pads 2300, 2302. Each of the PCBs 2400, 2402 may comprise a plurality of holes for receiving the same alignment pins 2210, 2212, 2214, 2216 that are used to align the insulator pads 2300, 2302.

Figure 25:
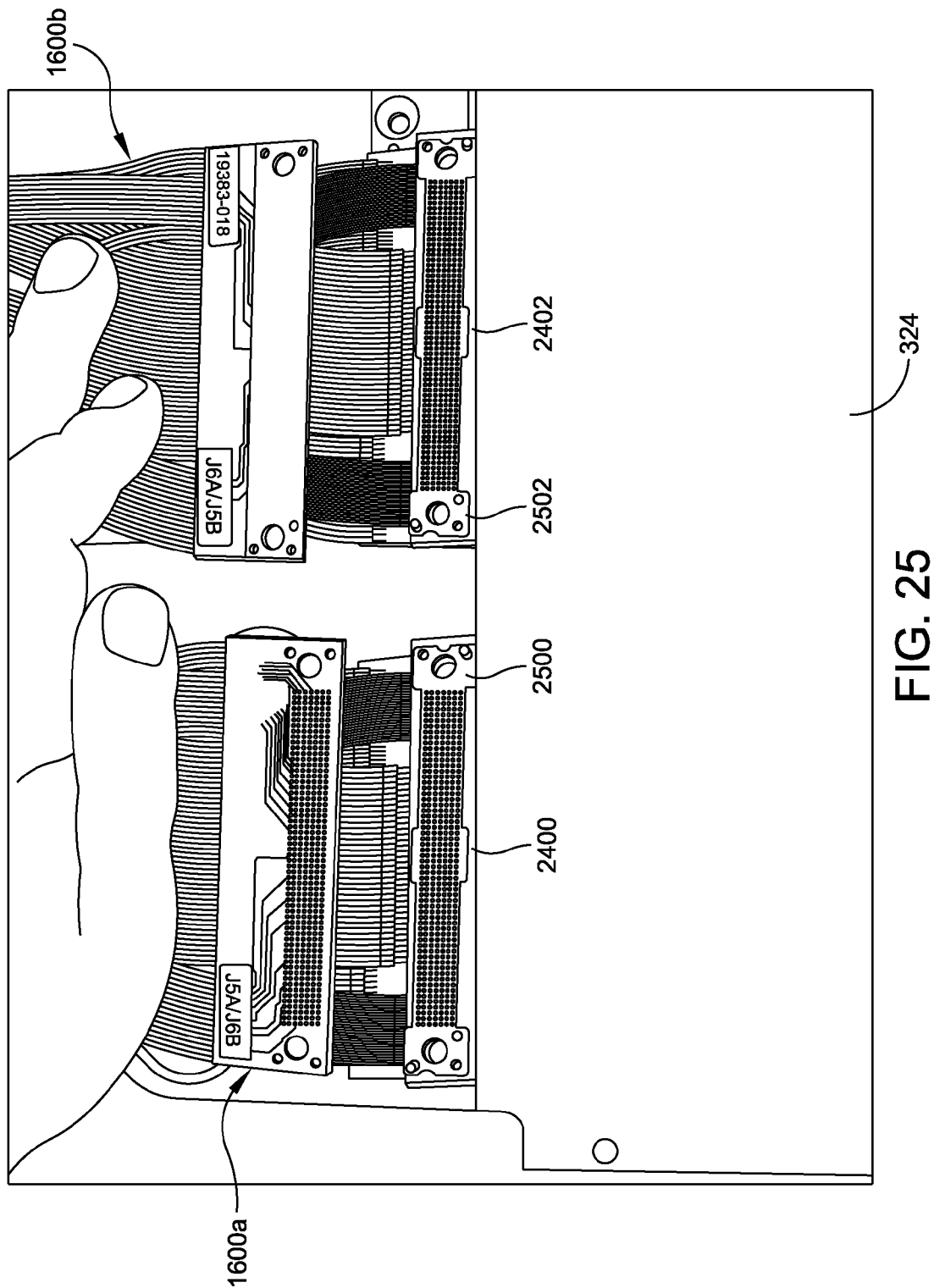
Figure 26:
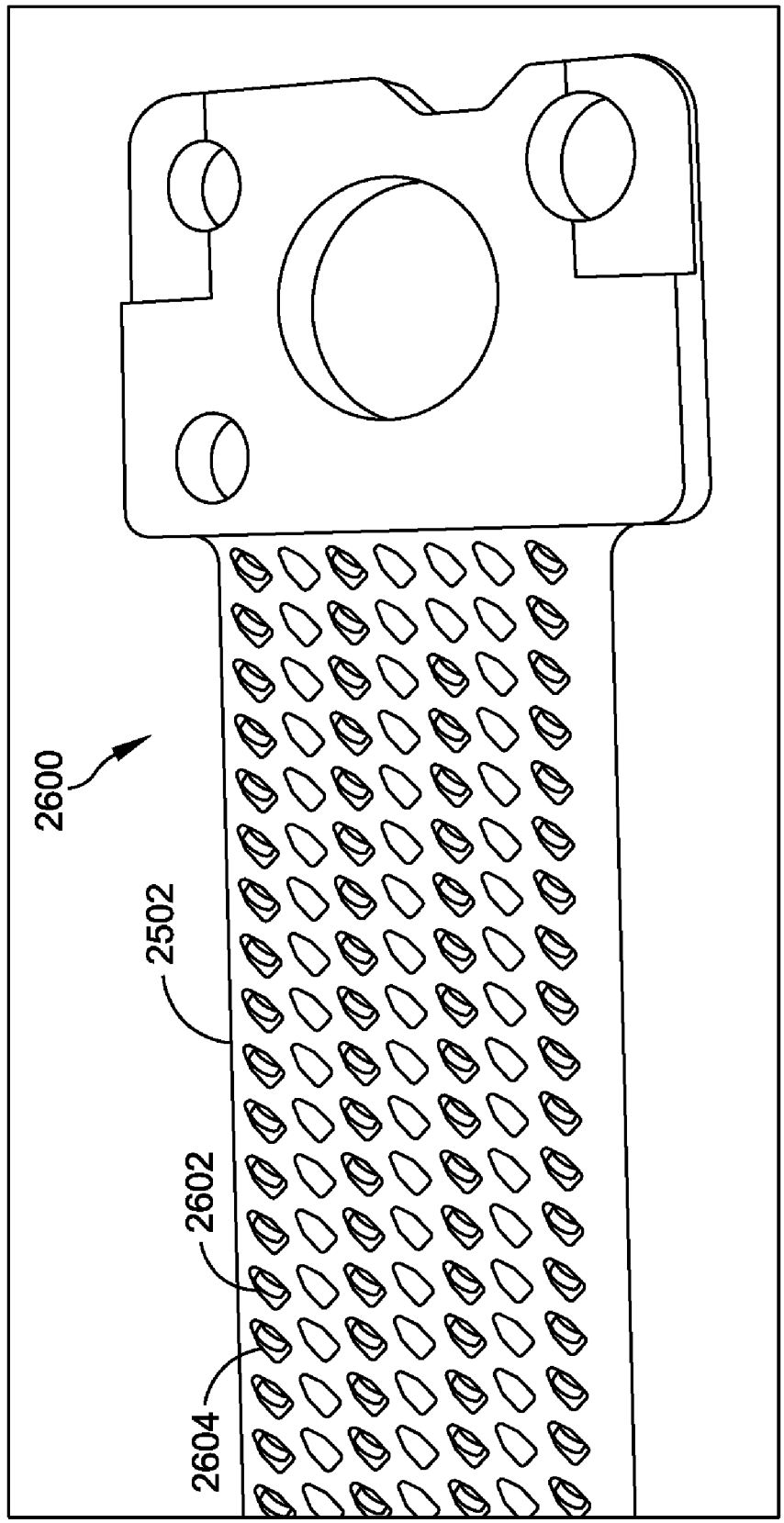

FIG. 25 illustrates the placement of test electronics interposers 2500, 2502 on the first PCBs 2400, 2402 of the "test electronics to DUT interfaces" 1600a, 1600b. Each of the test electronics interposers 2500, 2502 may comprise a plurality of holes for receiving the same alignment pins 2210, 2212, 2214, 2216 that are used to align the insulator pads 2300, 2302 and first PCBs 2400, 2402. An enlarged view of a portion 2600 of one of the interposers 2502 is shown in FIG. 26. By way of example, the electrical contacts of the interposer may comprise a plurality of fixed or spring-loaded contacts 2602, 2604 (e.g., pins). In one embodiment, the electrical contacts 2602, 2604 may comprise C-spring contacts, having a free length of 60 mils and a compressed length of 48 mils. The spring contacts ensure that good pressure is maintained between the electrical contacts of the first PCBs 2400, 2402, interposers 2500, 2502, and a test electronics board 326.

Figure 27:
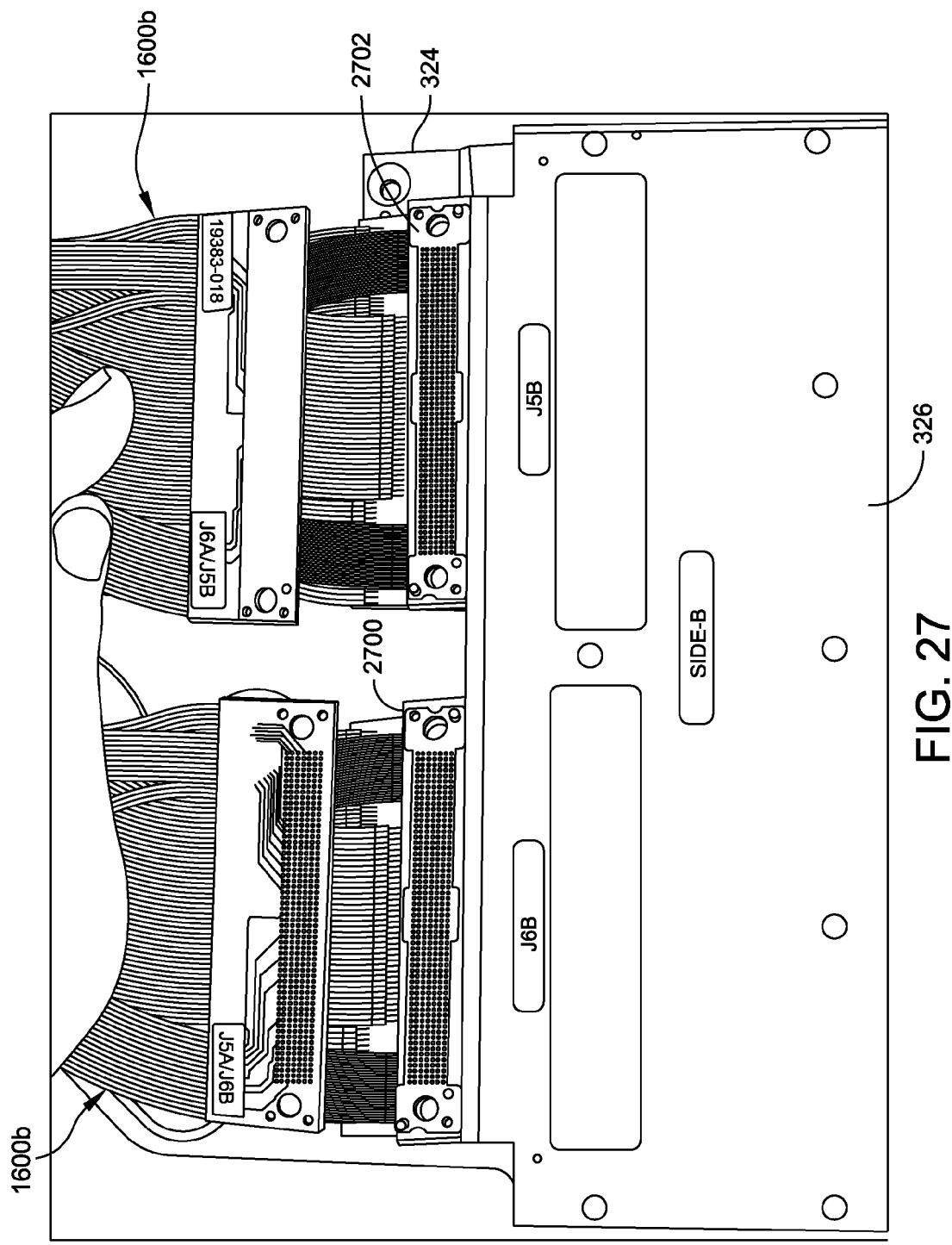

FIG. 27 illustrates the placement of a test electronics board 326 on the test electronics interposers 2500, 2502, as well as the placement of additional test electronics interposers 2700, 2702 on the test electronics board 326. Of note, each of the four test electronics interposers 2500, 2502, 2700, 2702 comprises a plurality of electrical contacts that mates with a corresponding plurality of electrical contacts on the test electronics board 326.

Figure 28:
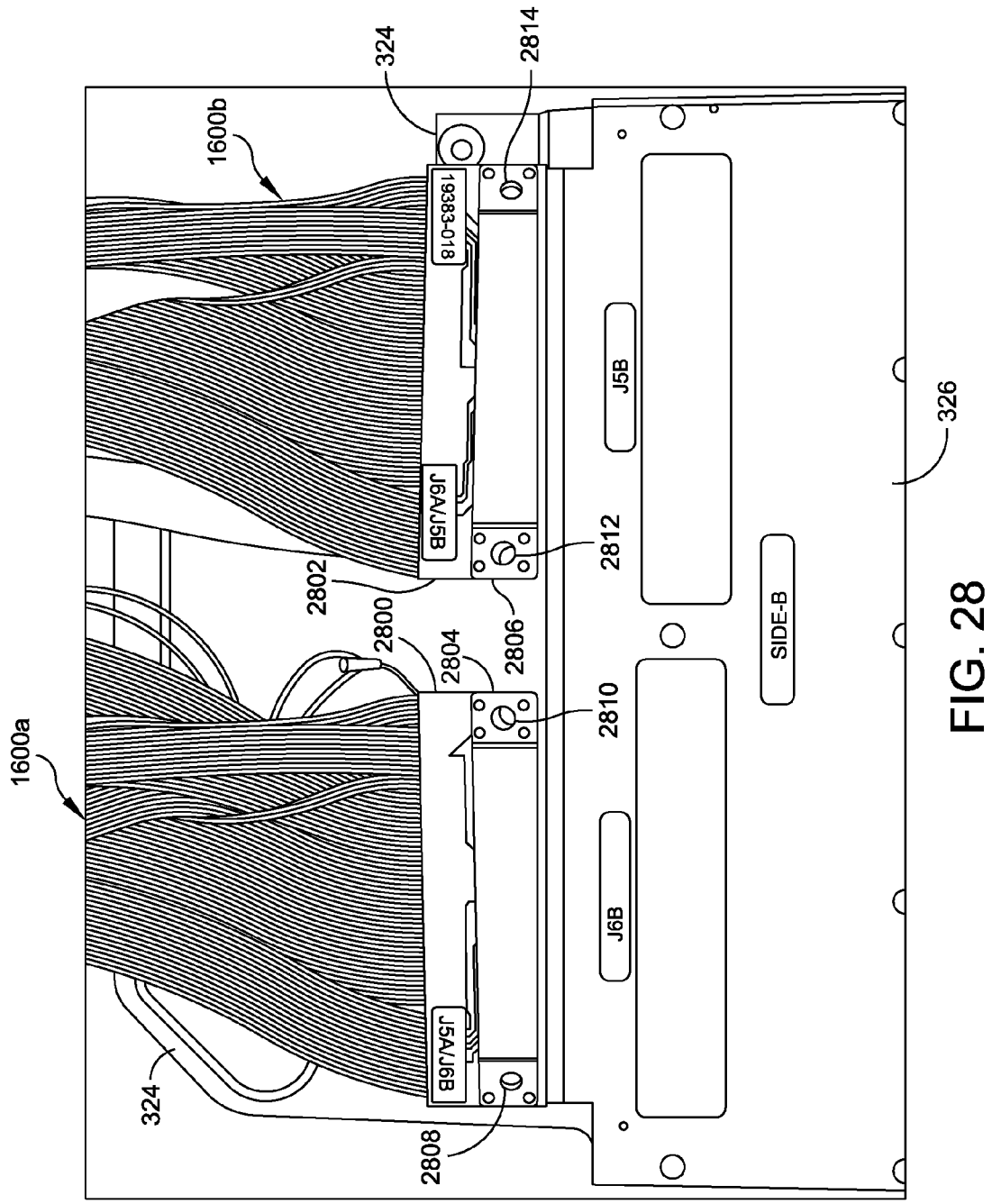

FIG. 28 illustrates the placement of the second PCBs 2800, 2802 of the "test electronics to DUT interfaces" 1600a, 1600b on the second set of test electronics interposers 2700, 2702, as well as the placement of insulating bolster plates 2804, 2806 over the second PCBs 2800, 2802. Bolts or screws may then be inserted through corresponding holes 2808, 2810, 2812, 2814 in all of the components shown in FIGS. 23-28, and fastened to the holes 2202, 2204, 2206, 2208 in the water block 324. The holes 2202, 2204, 2206, 2208 in the water block 324 are shown in FIG. 22.

Having described how a test electronics interface 1502 of the "test electronics to DUT interface" 1600 may be coupled to a test electronics board 326, a description of how the DUT interface 1504 of the "test electronics to DUT interface" 1600 may be coupled to a probe card 600 is now provided.

Figure 29:
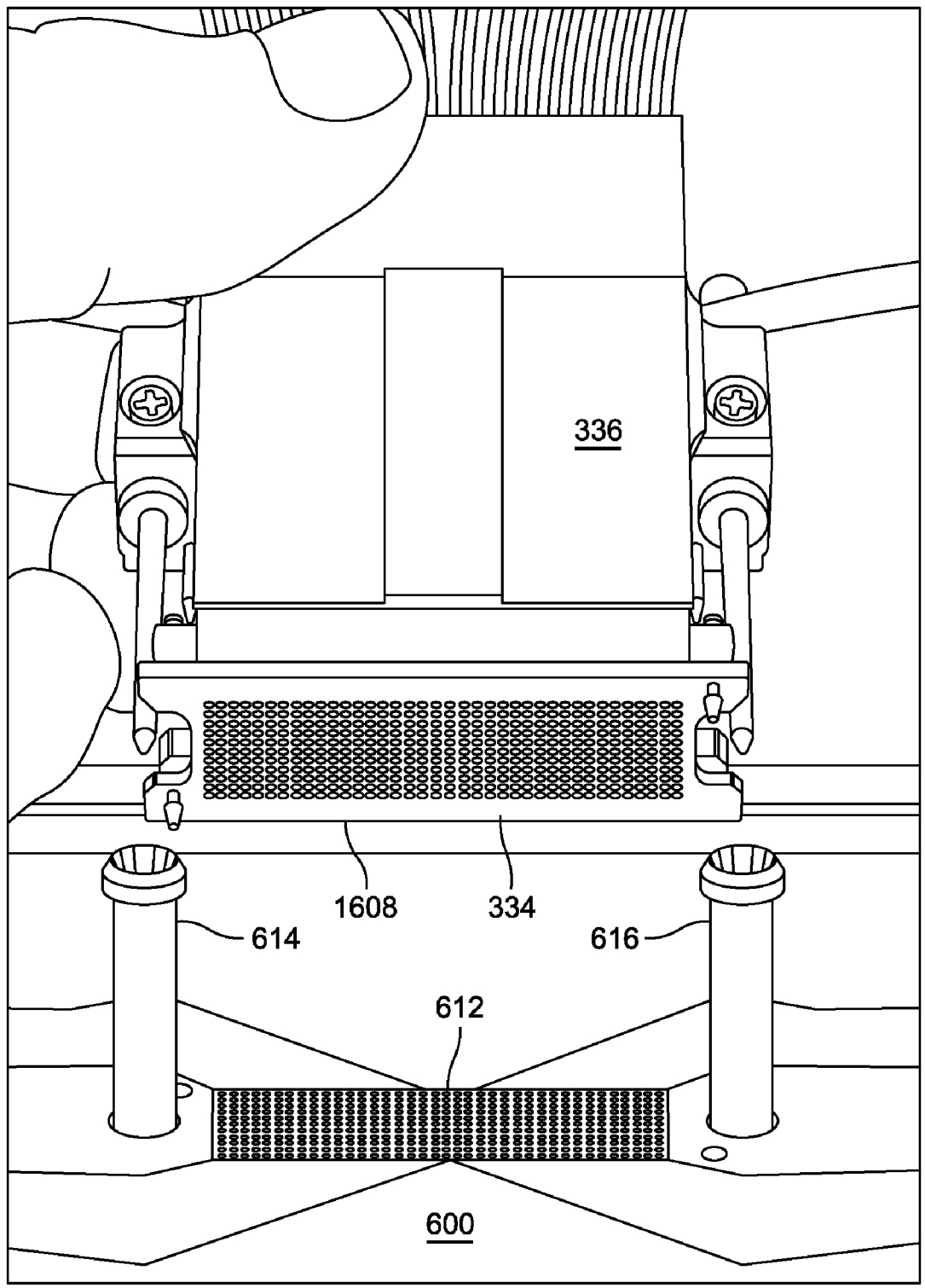
FIG. 29 provides a perspective view of the DUT interface shown in FIGS. 18 & 19.

FIG. 29 provides a perspective view of the DUT interface shown in FIGS. 18 & 19. The DUT interface comprises a ZIF connector and a DUT interposer. The ZIF connector comprises a flex circuit that is looped around a compliant flex circuit form, as best shown in FIG. 17. A portion of the flex circuit near a distal end of the compliant flex circuit form is visible in FIG. 29. However, most of the flex circuit is obscured in FIG. 29 by the ZIF connector housing, and by a DUT interposer having contacts that are electrically coupled to a electrical contacts on the outer surface of the flex circuit.

Coupled to the connector housing is a pair of alignment pins. The alignment pins are sized and positioned to fit into axial holes in a pair of latching pins on a probe card. To facilitate seating of the alignment pins in the holes, the ends of the alignment pins may be beveled or rounded. Similarly, the caps of the latching pins may have beveled or rounded detents therein. Another pair of alignment pins is provided on the DUT interposer, and the ends of these alignment pins may also be beveled or rounded. When positioning a probe card adjacent the DUT interface, the holes in the latching pins are aligned with the longer alignment pins of the connector housing, and the probe card is moved toward the DUT interface. See, FIG. 30. Subsequently, the alignment pins of the DUT interposer mate with corresponding holes in the surface of the probe card. In some cases, the alignment pins of the DUT interposer may not mate with the holes in the probe card until the DUT interface is actually clamped to the probe card.

Figure 30:
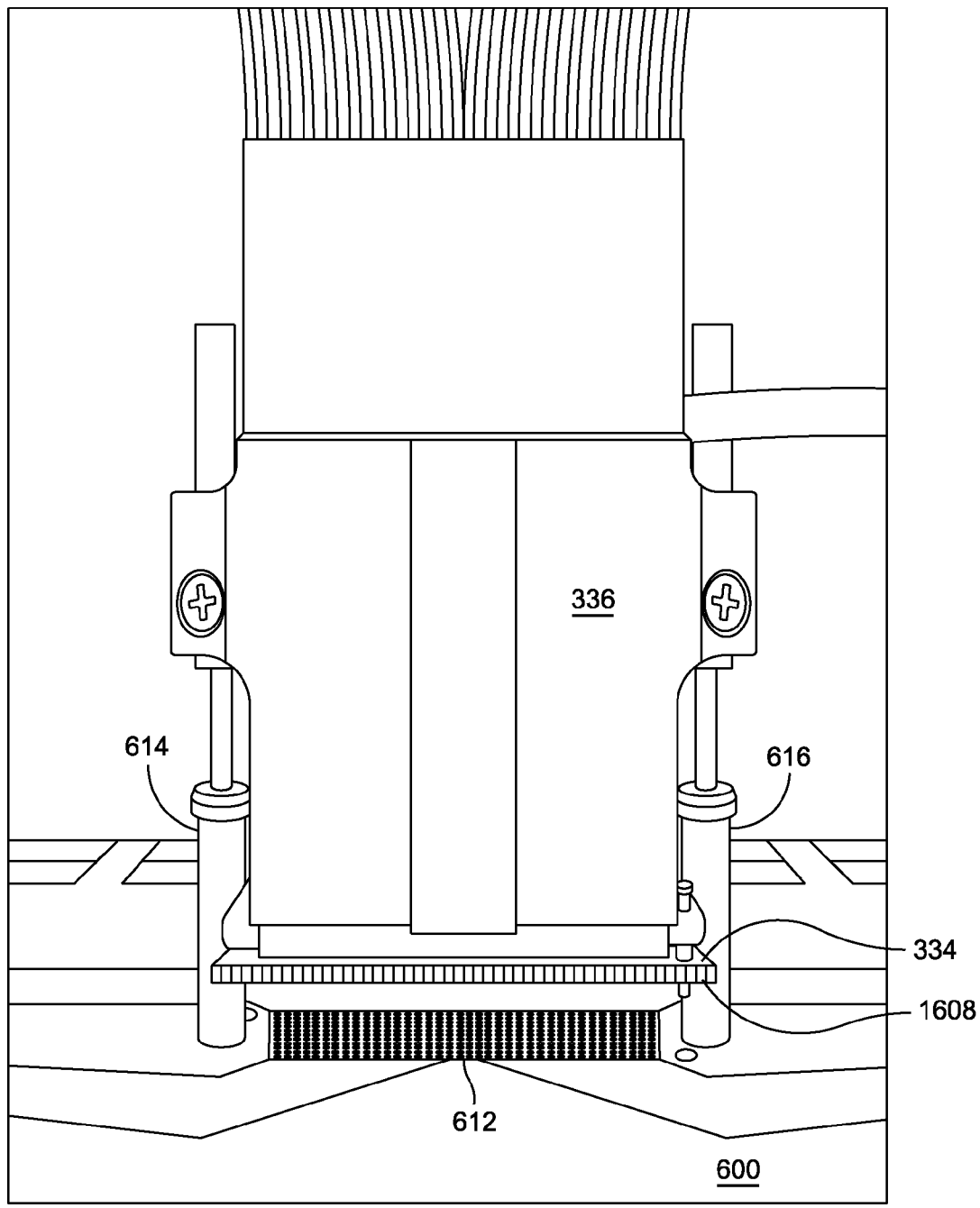
FIG. 30 shows how the DUT interposer may be affixed to the DUT interface as a whole.

FIG. 30 also shows how the DUT interposer may be affixed to the DUT interface as a whole. That is, a mounting plate may be positioned adjacent the compliant flex circuit form, opposite a side of the form that abuts the flex circuit. The mounting plate may then be screwed to the DUT interposer (or vice versa).

Figure 31:
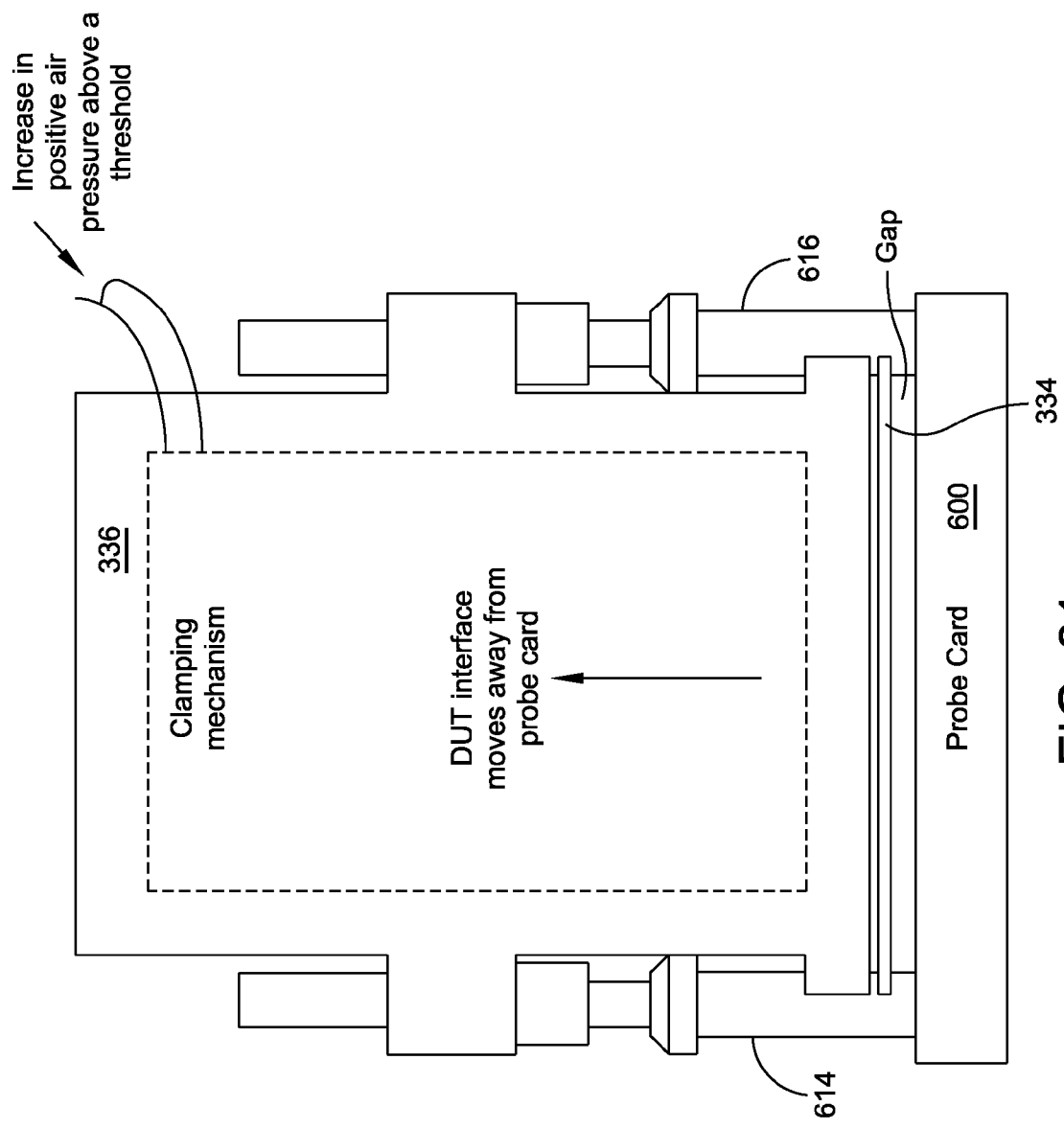
FIGS. 31 & 32 illustrate an exemplary operation of a ZIF connector to DUT clamping mechanism.
Figure 32:
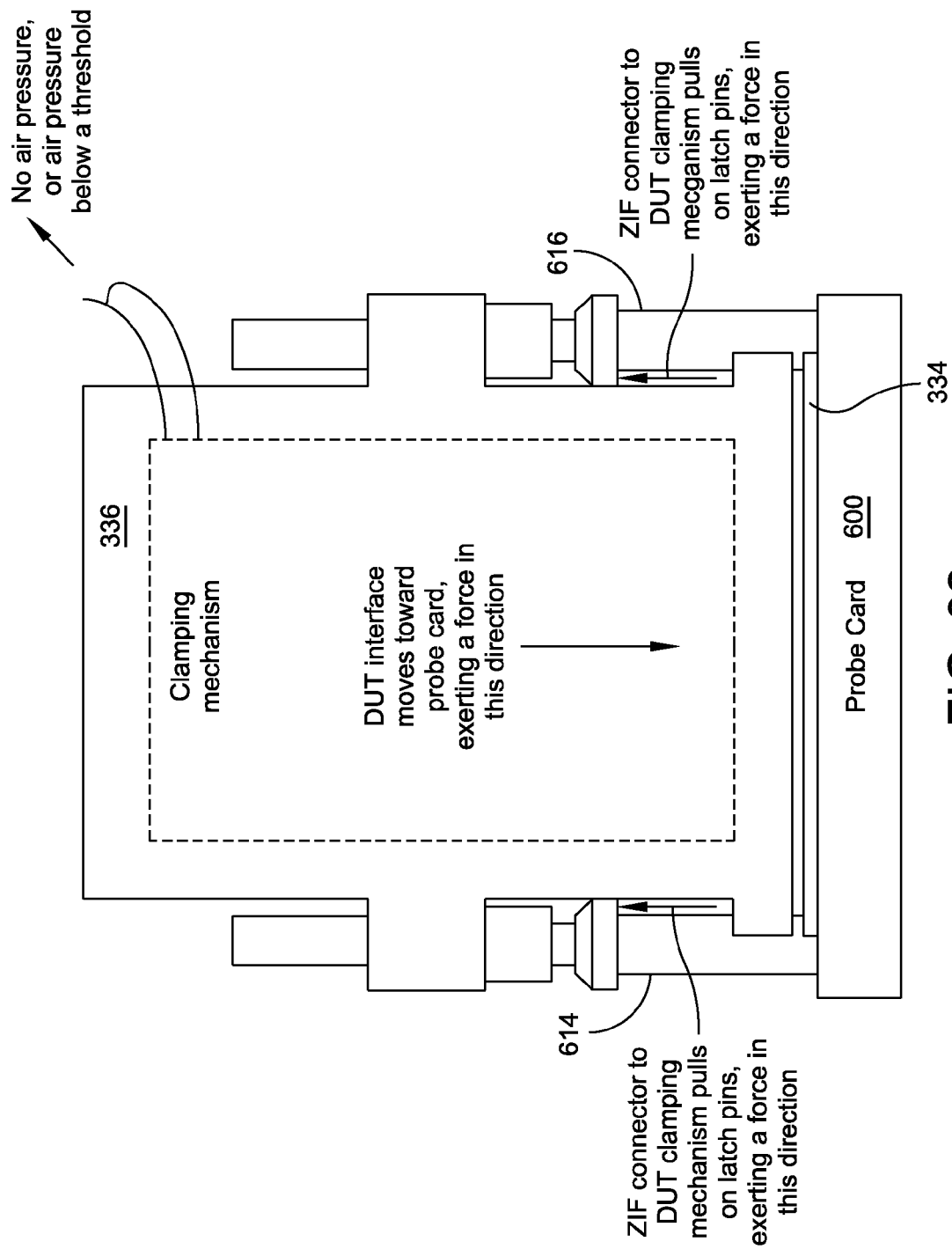

FIGS. 31 & 32 illustrate an exemplary operation of a ZIF connector to DUT clamping mechanism. As shown by the hashed box, the clamping mechanism may be primarily contained within the connector housing. In the exemplary embodiment shown, the clamping mechanism is actuated pneumatically, by regulating the air pressure supplied to the clamping mechanism via a tube or pipe. In other embodiments, the clamping mechanism could be actuated hydraulically or electrically, for example.

In one embodiment, an increase in positive air pressure applied to the clamping mechanism, above a threshold, causes the clamping mechanism to release the DUT interface from the probe card, allowing the DUT interface to move away from the probe card. See, FIG. 31. This may result in a small gap being formed between the DUT interface and the probe card, or may simply result in a loose abutment of the DUT interface to the probe card. When the air pressure applied to the clamping mechanism is released, or when it falls below a threshold, the clamping mechanism pulls on each of the latch pins, thereby exerting a first set of orthogonal forces in a direction away from the probe card. However, as the DUT interface is pressed against the probe card, the DUT interface exerts a second orthogonal force on the probe card, in a direction opposite to the first set of orthogonal forces. Given that the opposed and localized orthogonal forces offset each other, the DUT interface, when clamped to the probe card, applies a net zero force (or substantially net zero force) to the probe card. When many of the DUT interfaces are clamped to a probe card, such as the probe card shown in FIG. 5 or FIG. 10, the offsetting of each DUT interface's localized orthogonal forces means that no (or little) net force is applied to the probe card. As a result, deflection of the probe card is minimized, and the electrical contacts on a wafer can be more reliably coupled with corresponding electrical contacts on the probe card.

In some embodiments of the clamping mechanism described with respect to FIGS. 31 & 32, the clamping mechanism may engage and pull other types of latch pins (or other types of features) as it moves a DUT interface orthogonally towards a probe card or DUT.

Some embodiments of the test electronics to DUT interfaces disclosed herein have been used to provide about 30% more signals in half the area of previous interface solutions, providing a more than 2× increase in signal density. In addition, the test electronics to DUT interfaces disclosed herein can typically be produced at a much lower cost than previous interface solutions.

Although the description provided herein has generally focused on a wafer sort application, the test electronics to DUT interfaces described herein may be employed in various test and interface applications, including other automated test equipment (ATE) applications, such as engineering and final test applications.

A method of coupling a test electronics to DUT interface between a test electronics assembly and a probe card (or DUT) may comprise: 1) providing a test electronics to DUT interface comprising a test electronics interface that is electrically coupled to a DUT interface; 2) coupling the test electronics interface to a test electronics assembly (e.g., via at least one PCB and test electronics interposer of the test electronics interface); and 3) coupling the DUT interface to a probe card or DUT by causing a ZIF connector to DUT clamping mechanism of the DUT interface to pull on one or more features of the probe card or DUT, thereby exerting at least one force (i.e., a pulling force) that is directed orthogonally away from the probe card or DUT; wherein 4) as the DUT interface is pressed against (or coupled to) the probe card or DUT, an orthogonal force is applied toward the probe card or DUT, the orthogonal forces offsetting one another.

A method of configuring a test system may comprise installing test electronics assemblies of a first type in the test system, or installing test electronics of first and second types in the test system; the assemblies of the first type being coupled to a chassis to position their DUT interfaces along the perimeter of a first shape, and the assemblies of the second type being coupled to the chassis to position their DUT interfaces along the perimeter of a second shape, concentric with the first shape.

A method of configuring a test system may also comprise providing test electronics assemblies having ZIF connectors mounted thereon, the test electronics assemblies including i) a first type of test electronics assembly having ZIF connectors mounted thereon in first positions, and ii) a second type of test electronics assembly having ZIF connectors mounted thereon in second positions, the second positions differing from the first positions. A first test system may then be configured by installing a plurality of the first type of test electronics assembly, but none of the second type of test electronics assembly, in the first test system. Installing only the first type of test electronics assembly in the first test system positions the ZIF connectors of the first type of test electronics assembly along a perimeter of a first shape. A second test system may be configured by installing a plurality of the first type of test electronics assembly and a plurality of the second type of test electronics assembly in the second test system. Installing both the first type of test electronics assembly and the second type of test electronics assembly in the second test system positions the ZIF connectors of the first type of test electronics assembly along a perimeter of a first shape and positions the ZIF connectors of the second type of test electronics assembly along a perimeter of a second shape.

What is claimed is:

1. A test electronics to device under test (DUT) interface, comprising:
   a test electronics interface;
   a zero insertion force (ZIF) connector having:
      a compliant flex circuit form;
      a flex circuit having a first surface and a second surface, the flex circuit being looped around the flex circuit form with the first surface facing the flex circuit form, the flex circuit having a plurality of electrical contacts on the second surface, the plurality of electrical contacts providing at least part of a DUT interface, and the flex circuit having a plurality of electrical signal paths thereon, the plurality of electrical signal paths being coupled to the plurality of electrical contacts of the DUT interface; and
      a ZIF connector to DUT clamping mechanism; and
   a plurality of coaxial cables coupled between the test electronics interface and the electrical signal paths of the flex circuit.

2. The test electronics to DUT interface of claim 1, wherein the test electronics interface comprises at least one printed circuit board (PCB) to which the coaxial cables are electrically coupled.

3. The test electronics to DUT interface of claim 2, wherein the ATE interface further comprises at least one test electronics interposer, each of the at least one test electronics interposer having a first side and a second side, the first side of each test electronics interposer having a first plurality of electrical contacts that is electrically coupled to at least some of the coaxial cables via a respective one of the at least one PCB, and the second side of each test electronics interposer having a second plurality of electrical contacts that provide an electrical coupling to a test electronics assembly.

4. The test electronics to DUT interface of claim 1, wherein the test electronics interface comprises at least two printed circuit boards (PCBs) to which ones of the coaxial cables are electrically coupled.

5. The test electronics to DUT interface of claim 1, wherein the DUT interface further comprises a DUT interposer having a first side and a second side, the first side of the DUT interposer having a first plurality of electrical contacts coupled to the plurality of electrical contacts of the flex circuit, and the second side of the DUT interposer having a second plurality of electrical contacts coupled to the first plurality of electrical contacts, the second plurality of electrical contacts providing an electrical coupling to the DUT.

6. The test electronics to DUT interface of claim 1, wherein the ZIF connector to DUT clamping mechanism is configured to i) apply a first orthogonal force to a probe card that interfaces with a DUT, by pressing the DUT interface against the probe card, and simultaneously ii) exert a second orthogonal force on the probe card, the second orthogonal force being opposite in direction to the first orthogonal force.

7. The test electronics to DUT interface of claim 6, wherein the ZIF connector to DUT clamping mechanism comprises a pneumatically actuated clamping mechanism.

8. The test electronics to DUT interface of claim 1, wherein:
   the flex circuit has first and second opposing ends; and
   first and second subsets of the plurality of coaxial cables are respectively coupled to the first and second opposing ends of the flex circuit.

9. The test electronics to DUT interface of claim 1, wherein the electrical signal paths of the flex circuit comprise controlled impedance transmission line paths.

* * * * *